United States Patent
Vis et al.

(10) Patent No.: US 10,386,408 B2
(45) Date of Patent: Aug. 20, 2019

(54) METHODS AND APPARATUS FOR TESTING MILLIMETER WAVE DEVICES

(71) Applicant: QUALCOMM Incorporated, San Diego, CA (US)

(72) Inventors: Marvin Leroy Vis, Boulder, CO (US); Prasanna Madhusudhanan, Boulder, CO (US)

(73) Assignee: QUALCOMM Incorporated, San Diego, CA (US)

(*) Notice: Subject to any disclaimer, the term of this patent is extended or adjusted under 35 U.S.C. 154(b) by 71 days.

(21) Appl. No.: 15/825,709

(22) Filed: Nov. 29, 2017

(65) Prior Publication Data
US 2019/0025367 A1    Jan. 24, 2019

Related U.S. Application Data

(60) Provisional application No. 62/536,310, filed on Jul. 24, 2017.

(51) Int. Cl.
*G01R 1/04* (2006.01)
*H04B 7/26* (2006.01)
(Continued)

(52) U.S. Cl.
CPC ....... *G01R 31/2822* (2013.01); *G01R 1/0408* (2013.01); *G01R 29/105* (2013.01);
(Continued)

(58) Field of Classification Search
CPC .................. G01R 31/2822; G01R 1/0408; G01R 29/105; H04B 17/104; H04B 17/18;
(Continued)

(56) References Cited

U.S. PATENT DOCUMENTS 8,331,869 B2 * 12/2012 Foegelle ............ H04B 17/0082
                                                  455/115.2
8,412,112 B2    4/2013 Foegelle
(Continued)

FOREIGN PATENT DOCUMENTS

WO    2010040887 A1    4/2010
WO    2010139840 A1    12/2010

OTHER PUBLICATIONS

Gao X., et al., "On Simplifying Winner II Channel Model for MIMO OTA Performance Evaluation", Antennas and Propagation (EUCAP), Proceedings of the 5th European Conference on IEEE, Apr. 11, 2011 (Apr. 11, 2011), pp. 2942-2946, XP031877845, ISBN: 978-1-4577-0250-1.
(Continued)

*Primary Examiner* — Khai M Nguyen
(74) *Attorney, Agent, or Firm* — Patterson & Sheridan, LLP

(57) ABSTRACT

Certain aspects of the present disclosure relate to methods and apparatus for testing millimeter wave devices. The method includes determining a reference antenna response of the DUT for at least one antenna of a test chamber, generating one or more fading coefficients for the at least one antenna based on the determined reference antenna response, applying the generated one or more fading coefficients to at least one signal, and transmitting the at least one signal via the at least one antenna to the DUT in the test chamber.

30 Claims, 13 Drawing Sheets

(51) Int. Cl.
*G01R 29/10* (2006.01)
*G01R 31/28* (2006.01)
*H04B 17/10* (2015.01)
*H04B 17/14* (2015.01)
*H04B 17/18* (2015.01)
*H04B 17/391* (2015.01)

(52) U.S. Cl.
CPC ........... *H04B 17/104* (2015.01); *H04B 17/14* (2015.01); *H04B 17/18* (2015.01); *H04B 17/3911* (2015.01); *H04B 7/2668* (2013.01); *H04B 17/391* (2015.01)

(58) Field of Classification Search
CPC .. H04B 17/14; H04B 17/3911; H04B 17/391; H04B 7/2668
USPC .................... 343/703, 893; 455/67.12–67.13
See application file for complete search history.

(56) References Cited

U.S. PATENT DOCUMENTS

| 8,451,924 | B2 | 5/2013 | Ylitalo | |
| 8,730,112 | B2 | 5/2014 | Sakata et al. | |
| 8,880,002 | B2* | 11/2014 | Falck | H01Q 3/24 343/703 |
| 2013/0027256 | A1* | 1/2013 | Guo | H04L 41/0823 343/703 |

OTHER PUBLICATIONS

International Search Report and Written Opinion—PCT/US2018/041019—ISA/EPO—dated Oct. 10, 2018.
Kyosti P., et al., "MIMO OTA test concept with experimental and simulated verification", Antennas and Propagation (EUCAP), 2010 Proceedings of the Fourth European Conference on IEEE, Piscataway, NJ, USA, Apr. 12, 2010 (Apr. 12, 2010), pp. 1-5, XP031705569, ISBN: 978-1-4244-6431-9.
Fan W., et al., "Over-the-Air Performance Evaluation of Massive MIMO Base Stations in Sectorized Multi-Probe Anechoic Chambers", IEEE Antennas and Propagation Magazine, Jul. 17, 2017, 10 Pages.
Rohde-Schwarz: "Test Solutions for 5G to Enable Your Success", Massive MIMO Test Challenge, 2016, 6 Pages.

* cited by examiner

FIG. 8

| Cluster # | Normalized delay | Power dB | Clusters AoD ° | AoA ° | Zod ° | ZoA ° |
|---|---|---|---|---|---|---|
| 1 | 0.0000 | -13.4 | -178.1 | 51.3 | 50.2 | 125.4 |
| 2 | 0.3819 | 0 | -4.2 | -152.7 | 93.2 | 91.3 |
| 3 | 0.4025 | -2.2 | -4.2 | -152.7 | 93.2 | 91.3 |
| 4 | 0.5868 | -4 | -4.2 | -152.7 | 93.2 | 91.3 |
| 5 | 0.4610 | -6 | 90.2 | 76.6 | 122 | 94 |
| 6 | 0.5375 | -8.2 | 90.2 | 76.6 | 122 | 94 |
| 7 | 0.6708 | -9.9 | 90.2 | 76.6 | 122 | 94 |
| 8 | 0.5750 | -10.5 | 121.5 | -1.8 | 150.2 | 47.1 |
| 9 | 0.7618 | -7.5 | -81.7 | -41.9 | 55.2 | 56 |
| 10 | 1.5375 | -15.9 | 158.4 | 94.2 | 26.4 | 30.1 |
| 11 | 1.8978 | -6.6 | -83 | 51.9 | 126.4 | 58.8 |
| 12 | 2.2242 | -16.7 | 134.8 | -115.9 | 171.6 | 26 |
| 13 | 2.1718 | -12.4 | -153 | 26.6 | 151.4 | 49.2 |
| 14 | 2.4942 | -15.2 | -172 | 76.6 | 157.2 | 143.1 |
| 15 | 2.5119 | -10.8 | -129.9 | -7 | 47.2 | 117.4 |
| 16 | 3.0582 | -11.3 | -136 | -23 | 40.4 | 122.7 |
| 17 | 4.0810 | -12.7 | 165.4 | -47.2 | 43.3 | 123.2 |
| 18 | 4.4579 | -16.2 | 148.4 | 110.4 | 161.8 | 32.6 |
| 19 | 4.5695 | -18.3 | 132.7 | 144.5 | 10.8 | 27.2 |
| 20 | 4.7966 | -18.9 | -118.6 | 155.3 | 16.7 | 15.2 |
| 21 | 5.0066 | -16.6 | -154.1 | 102 | 171.7 | 146 |
| 22 | 5.3043 | -19.9 | 126.5 | -151.8 | 22.7 | 150.7 |
| 23 | 9.6586 | -29.7 | -56.2 | 55.2 | 144.9 | 156.1 |

| Parameter | $C_{ASD}$ ° | $C_{ASA}$ ° | Per-Cluster Parameters $C_{ZSD}$ ° | $C_{ZSA}$ ° | XPR dB |
|---|---|---|---|---|---|
| Unit | | | | | |
| Value | 5 | 11 | 3 | 3 | 10 |

METHODS AND APPARATUS FOR TESTING MILLIMETER WAVE DEVICES

CROSS-REFERENCE TO RELATED APPLICATIONS

This application claims the benefit of U.S. Application Ser. No. 62/536,310 entitled "METHODS AND APPARATUS FOR TESTING MILLIMETER WAVE DEVICES," which was filed Jul. 24, 2017. The aforementioned application is herein incorporated by reference in its entirety

FIELD

The present disclosure relates generally to communication systems, and more particularly, to methods and apparatus relating to testing millimeter wave devices.

BACKGROUND

Wireless communication systems are widely deployed to provide various telecommunication services such as telephony, video, data, messaging, and broadcasts. Typical wireless communication systems may employ multiple-access technologies capable of supporting communication with multiple users by sharing available system resources (e.g., bandwidth, transmit power). Examples of such multiple-access technologies include Long Term Evolution (LTE) systems, code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

In some examples, a wireless multiple-access communication system may include a number of base stations, each simultaneously supporting communication for multiple communication devices, otherwise known as user equipment (UEs). In LTE or LTE-A network, a set of one or more base stations may define an eNodeB (eNB). In other examples (e.g., in a next generation or 5G network), a wireless multiple access communication system may include a number of distributed units (DUs) (e.g., edge units (EUs), edge nodes (ENs), radio heads (RHs), smart radio heads (SRHs), transmission reception points (TRPs), etc.) in communication with a number of central units (CUs) (e.g., central nodes (CNs), access node controllers (ANCs), etc.), where a set of one or more distributed units, in communication with a central unit, may define an access node (e.g., a new radio base station (NR BS), a new radio node-B (NR NB), a network node, 5G NB, eNB, etc.). A base station or DU may communicate with a set of UEs on downlink channels (e.g., for transmissions from a base station or to a UE) and uplink channels (e.g., for transmissions from a UE to a base station or distributed unit).

These multiple access technologies have been adopted in various telecommunication standards to provide a common protocol that enables different wireless devices to communicate on a municipal, national, regional, and even global level. An example of an emerging telecommunication standard is new radio (NR), for example, 5G radio access. NR is a set of enhancements to the LTE mobile standard promulgated by Third Generation Partnership Project (3GPP). It is designed to better support mobile broadband Internet access by improving spectral efficiency, lowering costs, improving services, making use of new spectrum, and better integrating with other open standards using OFDMA with a cyclic prefix (CP) on the downlink (DL) and on the uplink (UL) as well as support beamforming, multiple-input multiple-output (MIMO) antenna technology, and carrier aggregation.

However, as the demand for mobile broadband access continues to increase, there exists a desire for further improvements in NR technology. Preferably, these improvements should be applicable to other multi-access technologies and the telecommunication standards that employ these technologies.

BRIEF SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description" one will understand how the features of this disclosure provide advantages that include improved communications between access points and stations in a wireless network.

Certain aspects provide a method of testing a wireless device-under-test (DUT). The method generally includes determining a reference antenna response of the DUT, generating one or more fading coefficients for at least one antenna of a test chamber based on the determined reference antenna response, applying the generated one or more fading coefficients to at least one signal, and transmitting the at least one signal via the at least one antenna to the DUT in the test chamber.

Also described herein are embodiments of a testing apparatus comprising one or more antennas, a memory, and a processor, the processor configured to execute the method described above for testing a wireless device-under-test (DUT).

Also as described herein are embodiments of an apparatus comprising means for executing the method described above for testing a wireless device-under-test (DUT).

Also as described herein are embodiments of a non-transitory computer readable medium comprising instructions to be executed in a testing apparatus, wherein the instructions when executed in the testing apparatus perform the method described above for testing a wireless device-under-test (DUT).

Aspects generally include methods, apparatus, systems, computer readable mediums, and processing systems, as substantially described herein with reference to and as illustrated by the accompanying drawings.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

FIG. 8 illustrates an example table including 23 clusters corresponding to a single clustered delay line (CDL) channel model, in accordance with certain aspects of the present disclosure.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 1:
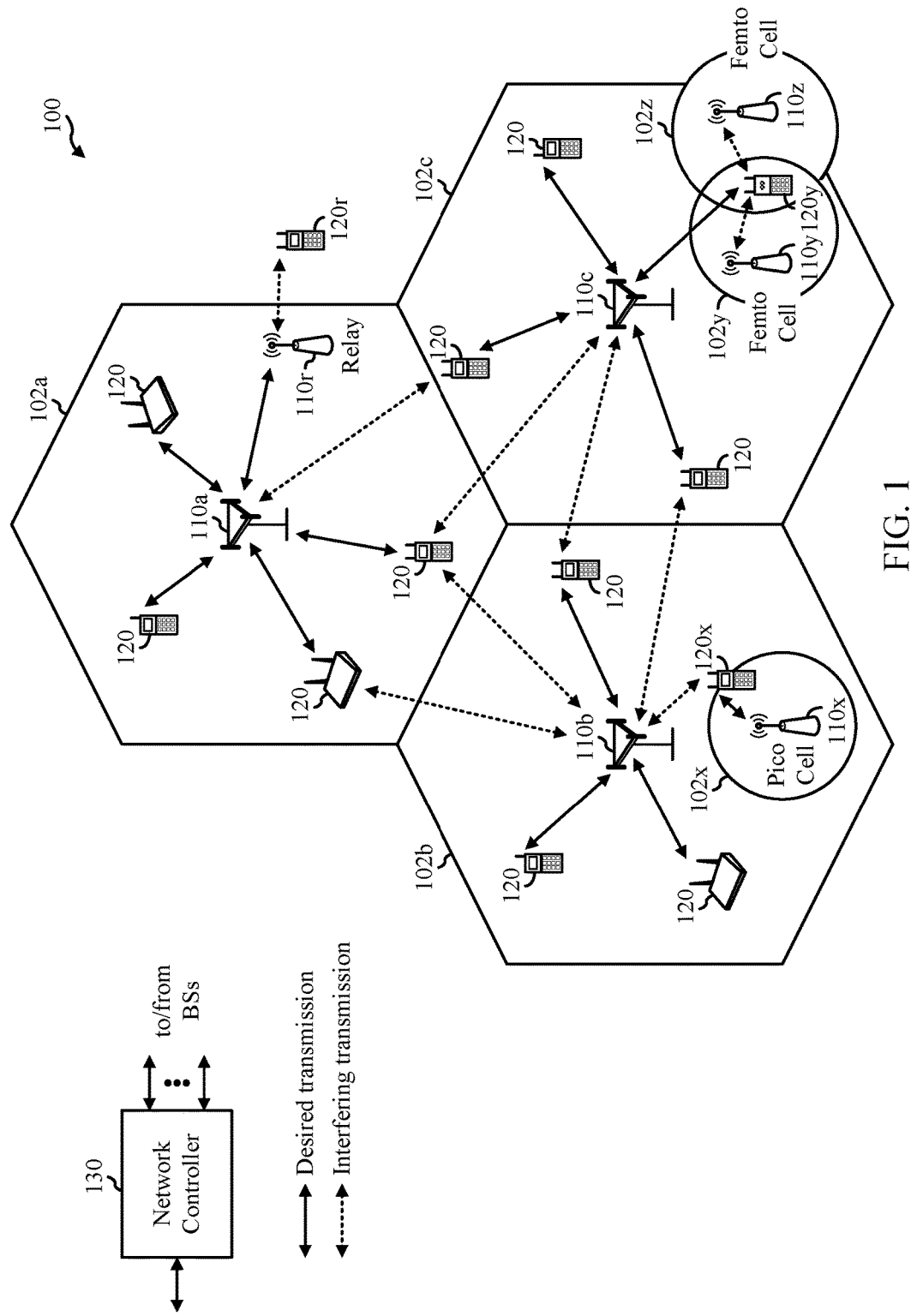
FIG. 1 is a block diagram conceptually illustrating an example telecommunications system, in accordance with certain aspects of the present disclosure.

Aspects of the present disclosure relate to methods and apparatus for testing millimeter wave devices.

Aspects of the present disclosure provide apparatus, methods, processing systems, and computer readable mediums for new radio (NR) (new radio access technology or 5G technology).

NR may support various wireless communication services, such as Enhanced mobile broadband (eMBB) targeting wide bandwidth (e.g. 80 MHz beyond), millimeter wave (mmW) targeting high carrier frequency (e.g. 60 GHz), massive MTC (mMTC) targeting non-backward compatible MTC techniques, and/or mission critical targeting ultra-reliable low latency communications (URLLC). These services may include latency and reliability requirements. These services may also have different transmission time intervals (TTI) to meet respective quality of service (QoS) requirements. In addition, these services may co-exist in the same subframe.

The following description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

The techniques described herein may be used for various wireless communication networks such as LTE, CDMA, TDMA, FDMA, OFDMA, SC-FDMA and other networks. The terms "network" and "system" are often used interchangeably. A CDMA network may implement a radio technology such as Universal Terrestrial Radio Access (UTRA), cdma2000, etc. UTRA includes Wideband CDMA (WCDMA) and other variants of CDMA. cdma2000 covers IS-2000, IS-95 and IS-856 standards. A TDMA network may implement a radio technology such as Global System for Mobile Communications (GSM). An OFDMA network may implement a radio technology such as NR (e.g. 5G RA), Evolved UTRA (E-UTRA), Ultra Mobile Broadband (UMB), IEEE 802.11 (Wi-Fi), IEEE 802.16 (WiMAX), IEEE 802.20, Flash-OFDMA, etc. UTRA and E-UTRA are part of Universal Mobile Telecommunication System (UMTS). NR is an emerging wireless communications technology under development in conjunction with the 5G Technology Forum (5GTF). 3GPP Long Term Evolution (LTE) and LTE-Advanced (LTE-A) are releases of UMTS that use E-UTRA. UTRA, E-UTRA, UMTS, LTE, LTE-A and GSM are described in documents from an organization named "3rd Generation Partnership Project" (3GPP). cdma2000 and UMB are described in documents from an organization named "3rd Generation Partnership Project 2" (3GPP2). The techniques described herein may be used for the wireless networks and radio technologies mentioned above as well as other wireless networks and radio technologies. For clarity, while aspects may be described herein using terminology commonly associated with 3G and/or 4G wireless technologies, aspects of the present disclosure can be applied in other generation-based communication systems, such as 5G and later, including NR technologies.

Example Wireless Communications System

FIG. 1 illustrates an example wireless network 100, such as a new radio (NR) or 5G network, in which aspects of the present disclosure may be performed.

As illustrated in FIG. 1, the wireless network 100 may include a number of BSs 110 and other network entities. A BS may be a station that communicates with UEs. Each BS 110 may provide communication coverage for a particular geographic area. In 3GPP, the term "cell" can refer to a coverage area of a Node B and/or a Node B subsystem serving this coverage area, depending on the context in which the term is used. In NR systems, the term "cell" and eNB, Node B, 5G NB, AP, NR BS, NR BS, or TRP may be interchangeable. In some examples, a cell may not necessarily be stationary, and the geographic area of the cell may move according to the location of a mobile base station. In some examples, the base stations may be interconnected to one another and/or to one or more other base stations or network nodes (not shown) in the wireless network 100 through various types of backhaul interfaces such as a direct physical connection, a virtual network, or the like using any suitable transport network.

In general, any number of wireless networks may be deployed in a given geographic area. Each wireless network may support a particular radio access technology (RAT) and may operate on one or more frequencies. A RAT may also be referred to as a radio technology, an air interface, etc. A frequency may also be referred to as a carrier, a frequency channel, etc. Each frequency may support a single RAT in a given geographic area in order to avoid interference between wireless networks of different RATs. In some cases, NR or 5G RAT networks may be deployed.

A BS may provide communication coverage for a macro cell, a pico cell, a femto cell, and/or other types of cell. A macro cell may cover a relatively large geographic area (e.g., several kilometers in radius) and may allow unrestricted access by UEs with service subscription. A pico cell may cover a relatively small geographic area and may allow unrestricted access by UEs with service subscription. A femto cell may cover a relatively small geographic area (e.g., a home) and may allow restricted access by UEs having association with the femto cell (e.g., UEs in a Closed Subscriber Group (CSG), UEs for users in the home, etc.). A BS for a macro cell may be referred to as a macro BS. A BS for a pico cell may be referred to as a pico BS. A BS for a femto cell may be referred to as a femto BS or a home BS. In the example shown in FIG. 1, the BSs 110a, 110b and 110c may be macro BSs for the macro cells 102a, 102b and 102c, respectively. The BS 110x may be a pico BS for a pico cell 102x. The BSs 110y and 110z may be femto BS for the femto cells 102y and 102z, respectively. A BS may support one or multiple (e.g., three) cells.

The wireless network 100 may also include relay stations. A relay station is a station that receives a transmission of data and/or other information from an upstream station (e.g., a BS or a UE) and sends a transmission of the data and/or other information to a downstream station (e.g., a UE or a BS). A relay station may also be a UE that relays transmissions for other UEs. In the example shown in FIG. 1, a relay station 110r may communicate with the BS 110a and a UE 120r in order to facilitate communication between the BS 110a and the UE 120r. A relay station may also be referred to as a relay BS, a relay, etc.

The wireless network 100 may be a heterogeneous network that includes BSs of different types, e.g., macro BS, pico BS, femto BS, relays, etc. These different types of BSs may have different transmit power levels, different coverage areas, and different impact on interference in the wireless network 100. For example, macro BS may have a high transmit power level (e.g., 20 Watts) whereas pico BS, femto BS, and relays may have a lower transmit power level (e.g., 1 Watt).

The wireless network 100 may support synchronous or asynchronous operation. For synchronous operation, the BSs may have similar frame timing, and transmissions from different BSs may be approximately aligned in time. For asynchronous operation, the BSs may have different frame timing, and transmissions from different BSs may not be aligned in time. The techniques described herein may be used for both synchronous and asynchronous operation.

A network controller 130 may be coupled to a set of BSs and provide coordination and control for these BSs. The network controller 130 may communicate with the BSs 110 via a backhaul. The BSs 110 may also communicate with one another, e.g., directly or indirectly via wireless or wireline backhaul.

The UEs 120 (e.g., 120x, 120y, etc.) may be dispersed throughout the wireless network 100, and each UE may be stationary or mobile. A UE may also be referred to as a mobile station, a terminal, an access terminal, a subscriber unit, a station, a Customer Premises Equipment (CPE), a cellular phone, a smart phone, a personal digital assistant (PDA), a wireless modem, a wireless communication device, a handheld device, a laptop computer, a cordless phone, a wireless local loop (WLL) station, a tablet, a camera, a gaming device, a netbook, a smartbook, an ultrabook, a medical device or medical equipment, a biometric sensor/device, a wearable device such as a smart watch, smart clothing, smart glasses, a smart wrist band, smart jewelry (e.g., a smart ring, a smart bracelet, etc.), an entertainment device (e.g., a music device, a video device, a satellite radio, etc.), a vehicular component or sensor, a smart meter/sensor, industrial manufacturing equipment, a global positioning system device, or any other suitable device that is configured to communicate via a wireless or wired medium. Some UEs may be considered evolved or machine-type communication (MTC) devices or evolved MTC (eMTC) devices. MTC and eMTC UEs include, for example, robots, drones, remote devices, sensors, meters, monitors, location tags, etc., that may communicate with a BS, another device (e.g., remote device), or some other entity. A wireless node may provide, for example, connectivity for or to a network (e.g., a wide area network such as Internet or a cellular network) via a wired or wireless communication link. Some UEs may be considered Internet-of-Things (IoT) devices. In FIG. 1, a solid line with double arrows indicates desired transmissions between a UE and a serving BS, which is a BS designated to serve the UE on the downlink and/or uplink. A dashed line with double arrows indicates interfering transmissions between a UE and a BS.

Certain wireless networks (e.g., LTE) utilize orthogonal frequency division multiplexing (OFDM) on the downlink and single-carrier frequency division multiplexing (SC-FDM) on the uplink. OFDM and SC-FDM partition the system bandwidth into multiple (K) orthogonal subcarriers, which are also commonly referred to as tones, bins, etc. Each subcarrier may be modulated with data. In general, modulation symbols are sent in the frequency domain with OFDM and in the time domain with SC-FDM. The spacing between adjacent subcarriers may be fixed, and the total number of subcarriers (K) may be dependent on the system bandwidth. For example, the spacing of the subcarriers may be 15 kHz and the minimum resource allocation (called a 'resource block') may be 12 subcarriers (or 180 kHz). Consequently, the nominal FFT size may be equal to 128, 256, 512, 1024 or 2048 for system bandwidth of 1.25, 2.5, 5, 10 or 20 megahertz (MHz), respectively. The system bandwidth may also be partitioned into subbands. For example, a subband may cover 1.08 MHz (i.e., 6 resource blocks), and there may be 1, 2, 4, 8 or 16 subbands for system bandwidth of 1.25, 2.5, 5, 10 or 20 MHz, respectively.

While aspects of the examples described herein may be associated with LTE technologies, aspects of the present disclosure may be applicable with other wireless communications systems, such as NR. NR may utilize OFDM with a CP on the uplink and downlink and include support for half-duplex operation using time division duplex (TDD). A single component carrier bandwidth of 100 MHz may be supported. NR resource blocks may span 12 sub-carriers with a sub-carrier bandwidth of 75 kHz over a 0.1 ms duration. Each radio frame may consist of 50 subframes with a length of 10 ms. Consequently, each subframe may have a length of 0.2 ms. Each subframe may indicate a link direction (i.e., DL or UL) for data transmission and the link direction for each subframe may be dynamically switched. Each subframe may include DL/UL data as well as DL/UL control data. UL and DL subframes for NR may be as described in more detail below with respect to FIGS. 6 and 7. Beamforming may be supported and beam direction may be dynamically configured. MIMO transmissions with precoding may also be supported. MIMO configurations in the DL may support up to 8 transmit antennas with multi-layer DL transmissions up to 8 streams and up to 2 streams per UE. Multi-layer transmissions with up to 2 streams per UE may be supported. Aggregation of multiple cells may be supported with up to 8 serving cells. Alternatively, NR may support a different air interface, other than an OFDM-based. NR networks may include entities such CUs and/or DUs.

In some examples, access to the air interface may be scheduled, wherein a scheduling entity (e.g., a base station) allocates resources for communication among some or all devices and equipment within its service area or cell. Within the present disclosure, as discussed further below, the scheduling entity may be responsible for scheduling, assigning, reconfiguring, and releasing resources for one or more subordinate entities. That is, for scheduled communication, subordinate entities utilize resources allocated by the scheduling entity. Base stations are not the only entities that may function as a scheduling entity. That is, in some examples, a UE may function as a scheduling entity, scheduling resources for one or more subordinate entities (e.g., one or more other UEs). In this example, the UE is functioning as a scheduling entity, and other UEs utilize resources scheduled by the UE for wireless communication. A UE may function as a scheduling entity in a peer-to-peer (P2P) network, and/or in a mesh network. In a mesh network example, UEs may optionally communicate directly with one another in addition to communicating with the scheduling entity.

Thus, in a wireless communication network with a scheduled access to time-frequency resources and having a cellular configuration, a P2P configuration, and a mesh configuration, a scheduling entity and one or more subordinate entities may communicate utilizing the scheduled resources.

As noted above, a RAN may include a CU and DUs. A NR BS (e.g., eNB, 5G Node B, Node B, transmission reception point (TRP), access point (AP)) may correspond to one or multiple BSs. NR cells can be configured as access cell (ACells) or data only cells (DCells). For example, the RAN (e.g., a central unit or distributed unit) can configure the cells. DCells may be cells used for carrier aggregation or dual connectivity, but not used for initial access, cell selection/reselection, or handover. In some cases DCells may not transmit synchronization signals—in some case cases DCells may transmit SS. NR BSs may transmit downlink signals to UEs indicating the cell type. Based on the cell type indication, the UE may communicate with the NR BS. For example, the UE may determine NR BSs to consider for cell selection, access, handover, and/or measurement based on the indicated cell type.

Figure 2:
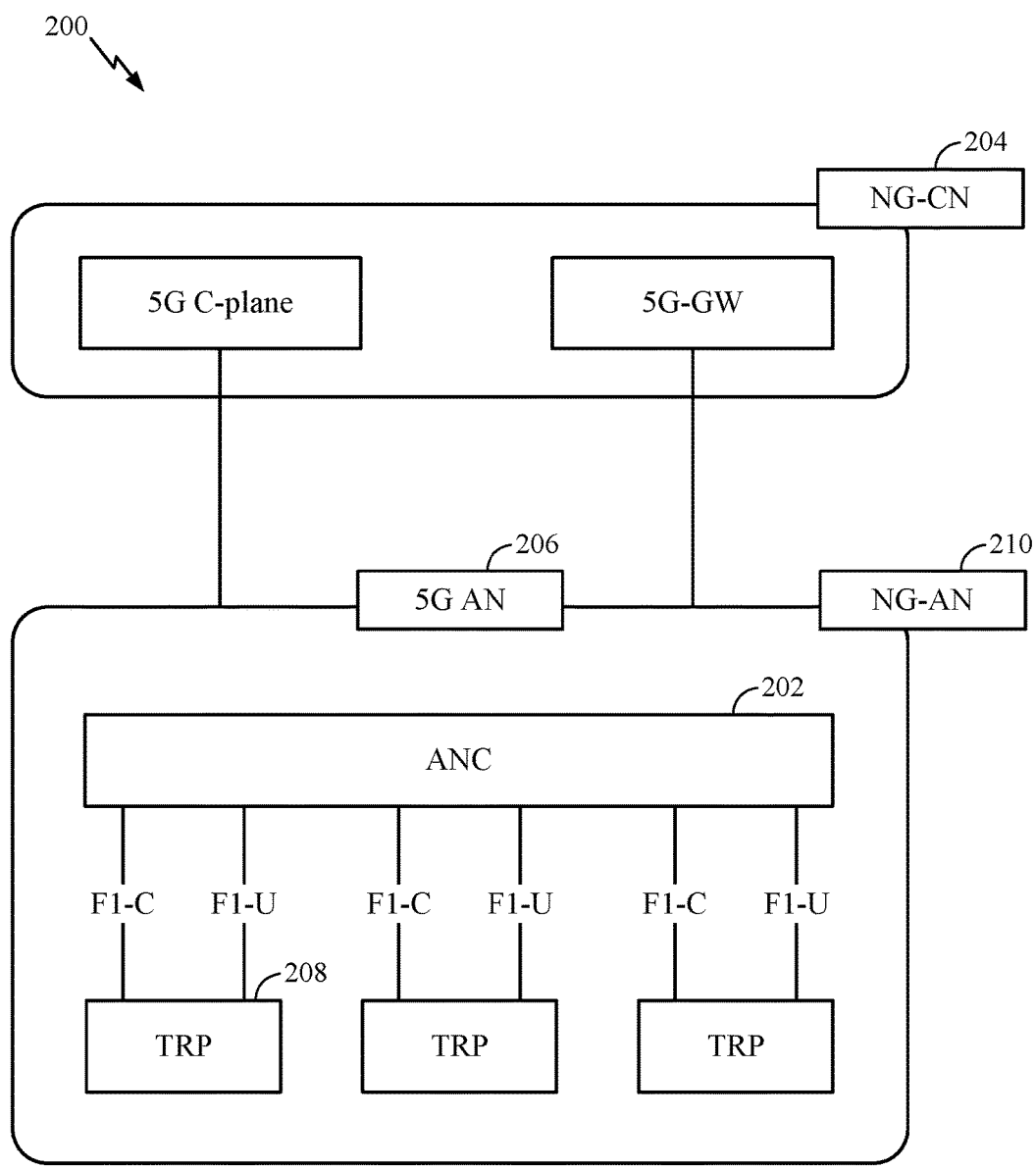
FIG. 2 is a block diagram illustrating an example logical architecture of a distributed RAN, in accordance with certain aspects of the present disclosure.

FIG. 2 illustrates an example logical architecture of a distributed radio access network (RAN) 200, which may be implemented in the wireless communication system illustrated in FIG. 1. A 5G access node 206 may include an access node controller (ANC) 202. The ANC may be a central unit (CU) of the distributed RAN 200. The backhaul interface to the next generation core network (NG-CN) 204 may terminate at the ANC. The backhaul interface to neighboring next generation access nodes (NG-ANs) may terminate at the ANC. The ANC may include one or more TRPs 208 (which may also be referred to as BSs, NR BSs, Node Bs, 5G NBs, APs, or some other term). As described above, a TRP may be used interchangeably with "cell."

The TRPs 208 may be a DU. The TRPs may be connected to one ANC (ANC 202) or more than one ANC (not illustrated). For example, for RAN sharing, radio as a service (RaaS), and service specific AND deployments, the TRP may be connected to more than one ANC. A TRP may include one or more antenna ports. The TRPs may be configured to individually (e.g., dynamic selection) or jointly (e.g., joint transmission) serve traffic to a UE.

The local architecture 200 may be used to illustrate fronthaul definition. The architecture may be defined that support fronthauling solutions across different deployment types. For example, the architecture may be based on transmit network capabilities (e.g., bandwidth, latency, and/or jitter).

The architecture may share features and/or components with LTE. According to aspects, the next generation AN (NG-AN) 210 may support dual connectivity with NR. The NG-AN may share a common fronthaul for LTE and NR.

The architecture may enable cooperation between and among TRPs 208. For example, cooperation may be preset within a TRP and/or across TRPs via the ANC 202. According to aspects, no inter-TRP interface may be needed/present.

According to aspects, a dynamic configuration of split logical functions may be present within the architecture 200. As will be described in more detail with reference to FIG. 5, the Radio Resource Control (RRC) layer, Packet Data Convergence Protocol (PDCP) layer, Radio Link Control (RLC) layer. Medium Access Control (MAC) layer, and a Physical (PHY) layers may be adaptably placed at the DU or CU (e.g., TRP or ANC, respectively). According to certain aspects, a BS may include a central unit (CU) (e.g., ANC 202) and/or one or more distributed units (e.g., one or more TRPs 208).

Figure 3:
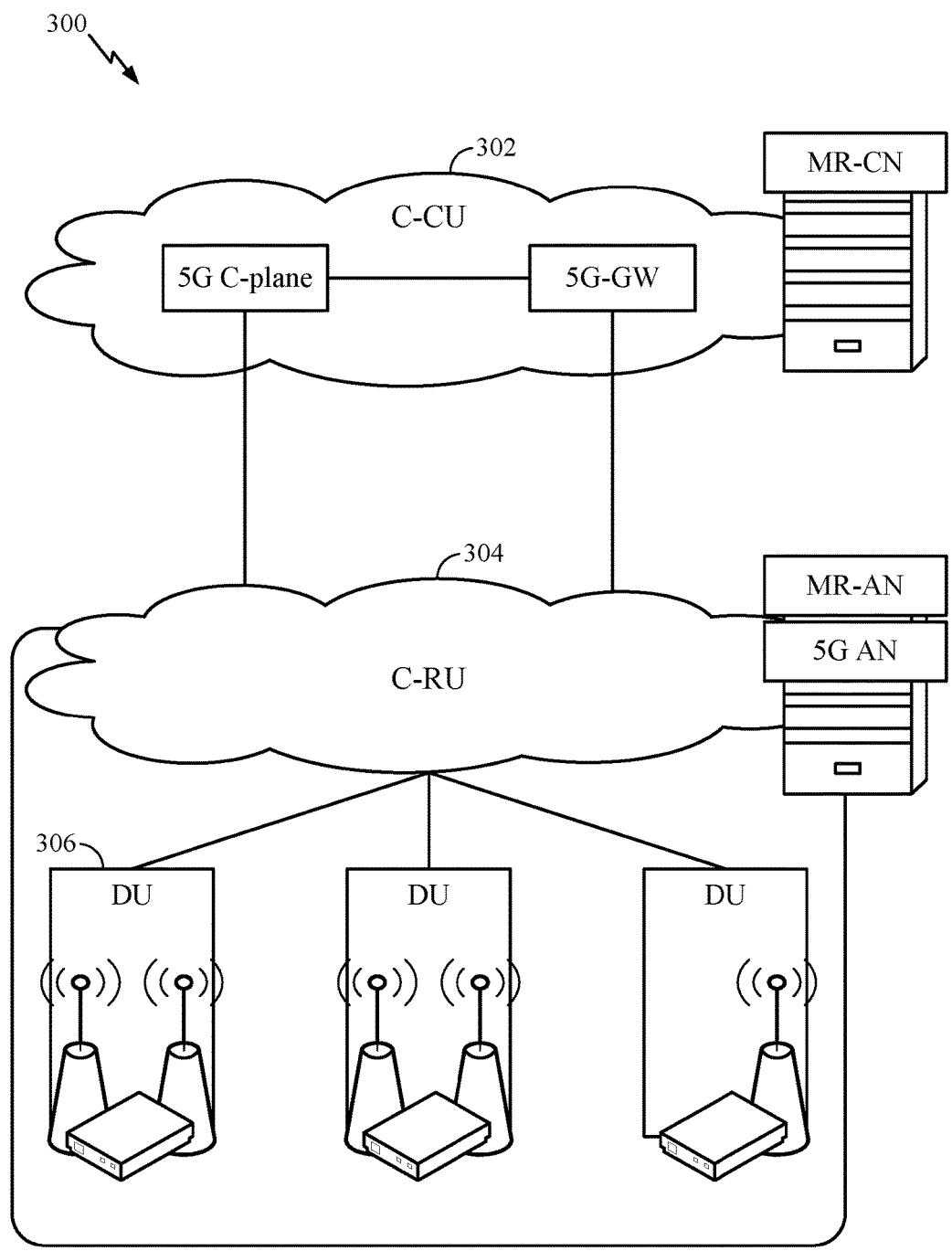
FIG. 3 is a diagram illustrating an example physical architecture of a distributed RAN, in accordance with certain aspects of the present disclosure.

FIG. 3 illustrates an example physical architecture of a distributed RAN 300, according to aspects of the present disclosure. A centralized core network unit (C-CU) 302 may host core network functions. The C-CU may be centrally deployed. C-CU functionality may be offloaded (e.g., to advanced wireless services (AWS)), in an effort to handle peak capacity.

A centralized RAN unit (C-RU) 304 may host one or more ANC functions. Optionally, the C-RU may host core network functions locally. The C-RU may have distributed deployment. The C-RU may be closer to the network edge.

A DU 306 may host one or more TRPs (edge node (EN), an edge unit (EU), a radio head (RH), a smart radio head (SRH), or the like). The DU may be located at edges of the network with radio frequency (RF) functionality.

Figure 4:
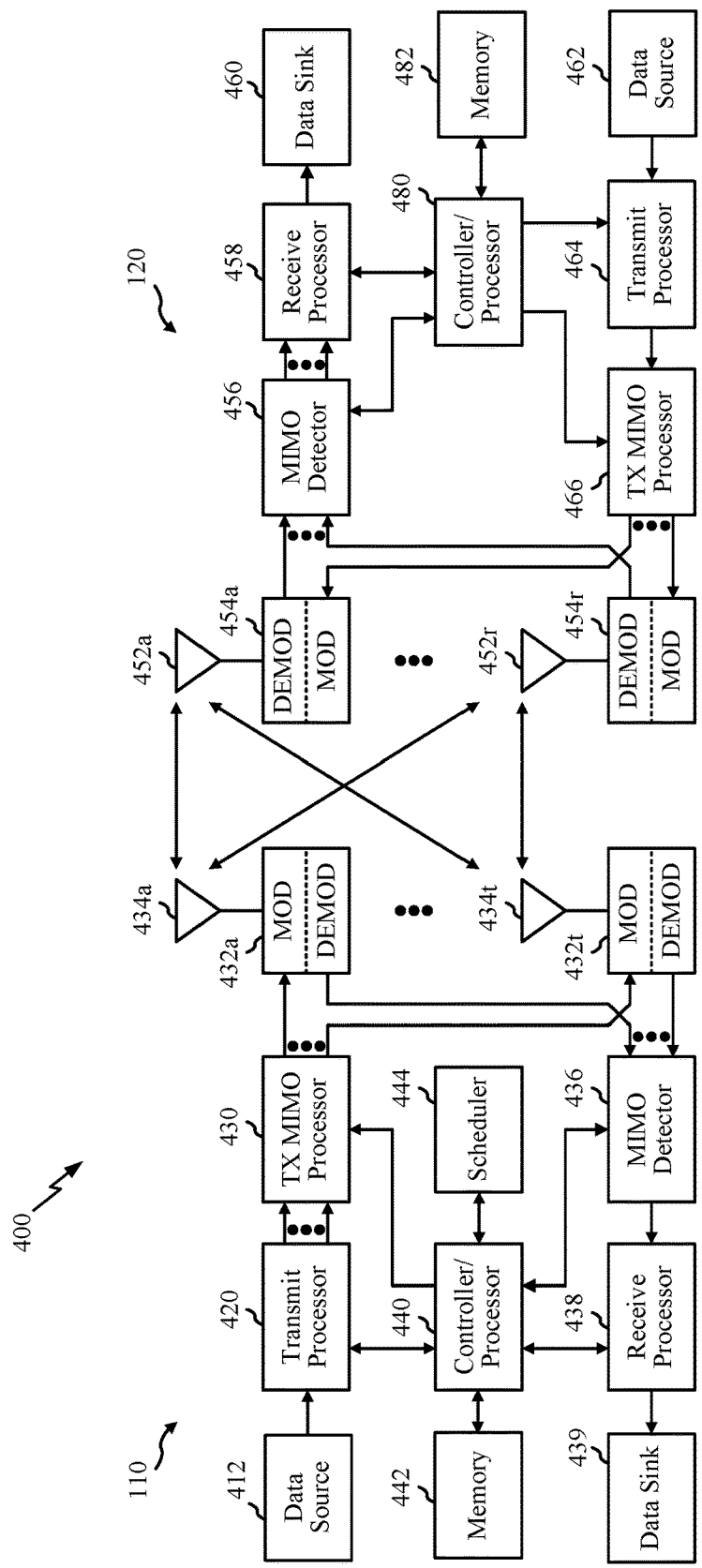
FIG. 4 is a block diagram conceptually illustrating a design of an example BS and user equipment (UE), in accordance with certain aspects of the present disclosure.

FIG. 4 illustrates example components of the BS 110 and UE 120 illustrated in FIG. 1, which may be used to implement aspects of the present disclosure. As described above, the BS may include a TRP. One or more components of the BS 110 and UE 120 may be used to practice aspects of the present disclosure. For example, antennas 452, Tx/Rx 222, processors 466, 458, 464, and/or controller/processor 480 of the UE 120 and/or antennas 434, processors 460, 420, 438, and/or controller/processor 440 of the BS 110 may be used to perform the operations described herein.

FIG. 4 shows a block diagram of a design of a BS 110 and a UE 120, which may be one of the BSs and one of the UEs in FIG. 1. For a restricted association scenario, the base station 110 may be the macro BS 110c in FIG. 1, and the UE 120 may be the UE 120y. The base station 110 may also be a base station of some other type. The base station 110 may be equipped with antennas 434a through 434t, and the UE 120 may be equipped with antennas 452a through 452r.

At the base station 110, a transmit processor 420 may receive data from a data source 412 and control information from a controller/processor 440. The control information may be for the Physical Broadcast Channel (PBCH), Physical Control Format Indicator Channel (PCFICH), Physical Hybrid ARQ Indicator Channel (PHICH), Physical Downlink Control Channel (PDCCH), etc. The data may be for the Physical Downlink Shared Channel (PDSCH), etc. The processor 420 may process (e.g., encode and symbol map) the data and control information to obtain data symbols and control symbols, respectively. The processor 420 may also generate reference symbols, e.g., for the PSS, SSS, and cell-specific reference signal. A transmit (TX) multiple-input multiple-output (MIMO) processor 430 may perform spatial processing (e.g., precoding) on the data symbols, the control symbols, and/or the reference symbols, if applicable, and may provide output symbol streams to the modulators (MODs) 432a through 432t. For example, the TX MIMO processor 430 may perform certain aspects described herein for RS multiplexing. Each modulator 432 may process a respective output symbol stream (e.g., for OFDM, etc.) to obtain an output sample stream. Each modulator 432 may further process (e.g., convert to analog, amplify, filter, and upconvert) the output sample stream to obtain a downlink signal. Downlink signals from modulators 432a through 432t may be transmitted via the antennas 434a through 434t, respectively.

At the UE 120, the antennas 452a through 452r may receive the downlink signals from the base station 110 and may provide received signals to the demodulators (DEMODs) 454a through 454r, respectively. Each demodulator 454 may condition (e.g., filter, amplify, downconvert, and digitize) a respective received signal to obtain input samples. Each demodulator 454 may further process the input samples (e.g., for OFDM, etc.) to obtain received symbols. A MIMO detector 456 may obtain received symbols from all the demodulators 454a through 454r, perform MIMO detection on the received symbols if applicable, and provide detected symbols. For example, MIMO detector 456 may provide detected RS transmitted using techniques described herein. A receive processor 458 may process (e.g., demodulate, deinterleave, and decode) the detected symbols, provide decoded data for the UE 120 to a data sink 460, and provide decoded control information to a controller/processor 480. According to one or more cases, CoMP aspects can include providing the antennas, as well as some Tx/Rx functionalities, such that they reside in distributed units. For example, some Tx/Rx processings can be done in the central unit, while other processing can be done at the distributed units. For example, in accordance with one or more aspects as shown in the diagram, the BS mod/demod 432 may be in the distributed units.

On the uplink, at the UE 120, a transmit processor 464 may receive and process data (e.g., for the Physical Uplink Shared Channel (PUSCH)) from a data source 462 and control information (e.g., for the Physical Uplink Control Channel (PUCCH) from the controller/processor 480. The transmit processor 464 may also generate reference symbols for a reference signal. The symbols from the transmit processor 464 may be precoded by a TX MIMO processor 466 if applicable, further processed by the demodulators 454a through 454r (e.g., for SC-FDM, etc.), and transmitted to the base station 110. At the BS 110, the uplink signals from the UE 120 may be received by the antennas 434, processed by the modulators 432, detected by a MIMO detector 436 if applicable, and further processed by a receive processor 438 to obtain decoded data and control information sent by the UE 120. The receive processor 438 may provide the decoded data to a data sink 439 and the decoded control information to the controller/processor 440.

The controllers/processors 440 and 480 may direct the operation at the base station 110 and the UE 120, respectively. The processor 440 and/or other processors and modules at the base station 110 may perform or direct processes for the techniques described herein. The processor 480 and/or other processors and modules at the UE 120 may also perform or direct processes for the techniques described herein. The memories 442 and 482 may store data and program codes for the BS 110 and the UE 120, respectively. A scheduler 444 may schedule UEs for data transmission on the downlink and/or uplink.

Figure 5:
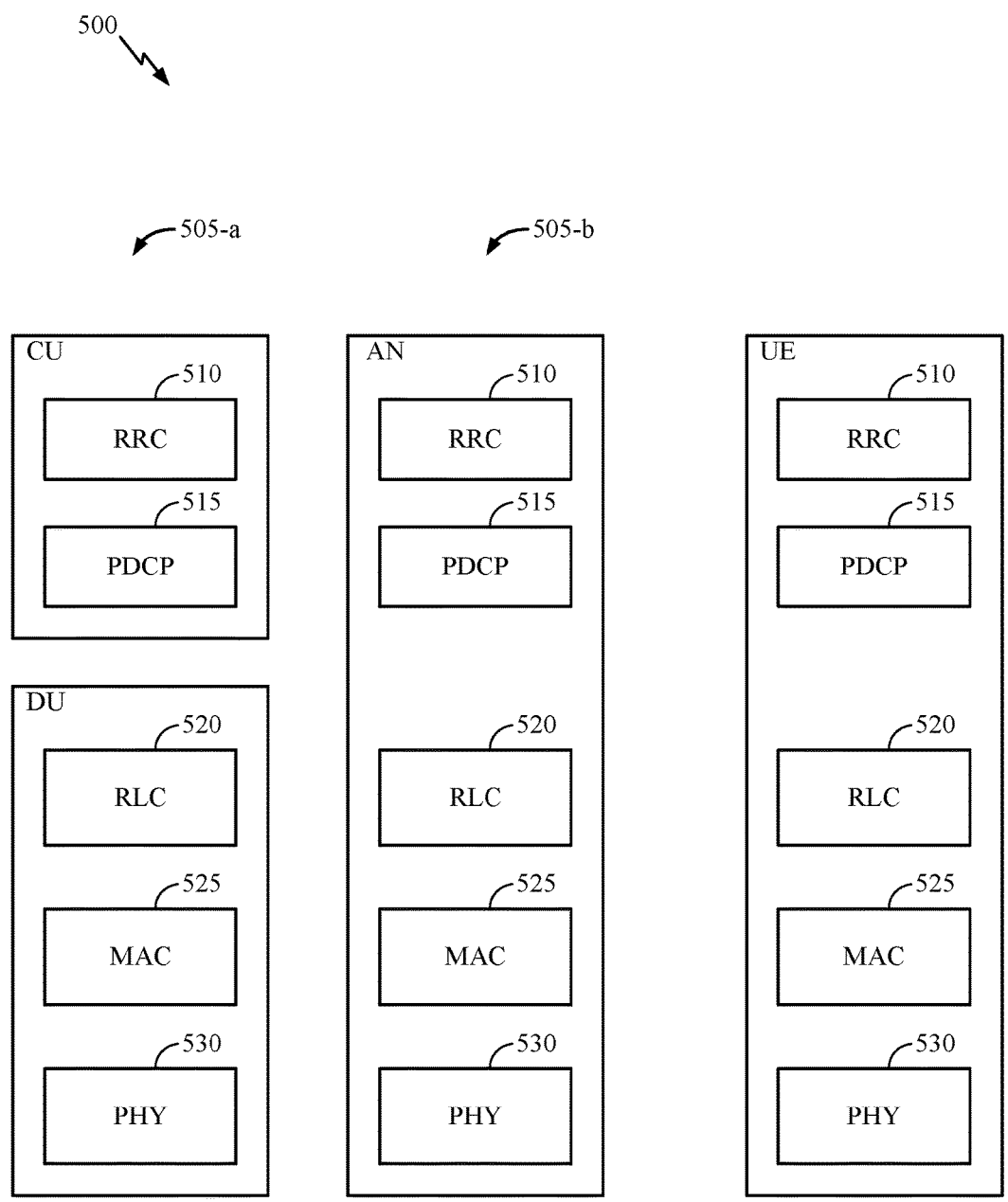
FIG. 5 is a diagram showing examples for implementing a communication protocol stack, in accordance with certain aspects of the present disclosure.

FIG. 5 illustrates a diagram 500 showing examples for implementing a communications protocol stack, according to aspects of the present disclosure. The illustrated communications protocol stacks may be implemented by devices operating in a in a 5G system (e.g., a system that supports uplink-based mobility). Diagram 500 illustrates a communications protocol stack including a Radio Resource Control (RRC) layer 510, a Packet Data Convergence Protocol (PDCP) layer 515, a Radio Link Control (RLC) layer 520, a Medium Access Control (MAC) layer 525, and a Physical (PHY) layer 530. In various examples the layers of a protocol stack may be implemented as separate modules of software, portions of a processor or ASIC, portions of non-collocated devices connected by a communications link, or various combinations thereof. Collocated and non-collocated implementations may be used, for example, in a protocol stack for a network access device (e.g., ANs, CUs, and/or DUs) or a UE.

A first option 505-a shows a split implementation of a protocol stack, in which implementation of the protocol stack is split between a centralized network access device (e.g., an ANC 202 in FIG. 2) and distributed network access device (e.g., DU 208 in FIG. 2). In the first option 505-a, an RRC layer 510 and a PDCP layer 515 may be implemented by the central unit, and an RLC layer 520, a MAC layer 525, and a PHY layer 530 may be implemented by the DU. In various examples the CU and the DU may be collocated or non-collocated. The first option 505-a may be useful in a macro cell, micro cell, or pico cell deployment.

A second option 505-b shows a unified implementation of a protocol stack, in which the protocol stack is implemented in a single network access device (e.g., access node (AN), new radio base station (NR BS), a new radio Node-B (NR NB), a network node (NN), or the like.). In the second option, the RRC layer 510, the PDCP layer 515, the RLC layer 520, the MAC layer 525, and the PHY layer 530 may each be implemented by the AN. The second option 505-b may be useful in a femto cell deployment.

Regardless of whether a network access device implements part or all of a protocol stack, a UE may implement an entire protocol stack (e.g., the RRC layer 510, the PDCP layer 515, the RLC layer 520, the MAC layer 525, and the PHY layer 530).

Figure 6:
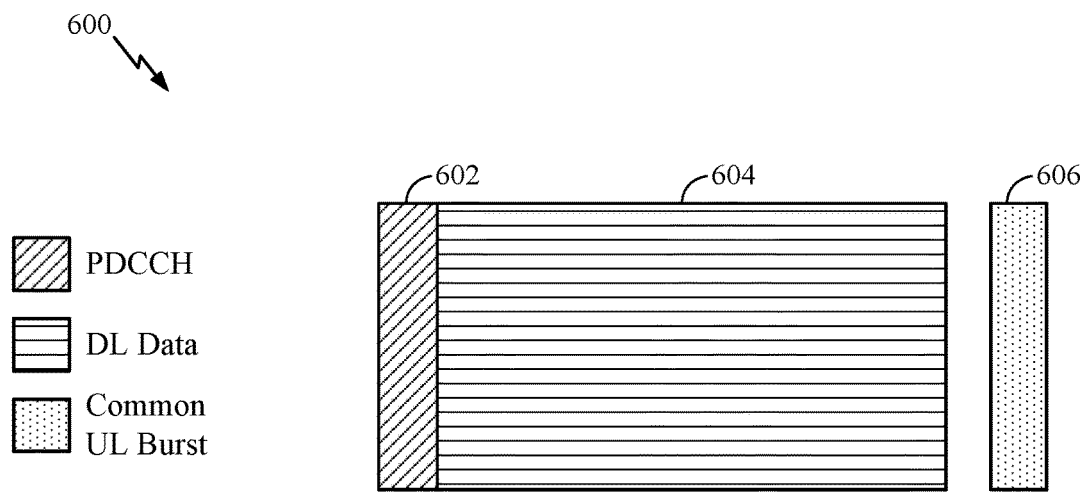
FIG. 6 illustrates an example of a DL-centric subframe, in accordance with certain aspects of the present disclosure.

FIG. 6 is a diagram 600 showing an example of a DL-centric subframe. The DL-centric subframe may include a control portion 602. The control portion 602 may exist in the initial or beginning portion of the DL-centric subframe. The control portion 602 may include various scheduling information and/or control information corresponding to various portions of the DL-centric subframe. In some configurations, the control portion 602 may be a physical DL control channel (PDCCH), as indicated in FIG. 6. The DL-centric subframe may also include a DL data portion 604. The DL data portion 604 may sometimes be referred to as the payload of the DL-centric subframe. The DL data portion 604 may include the communication resources utilized to communicate DL data from the scheduling entity (e.g., UE or BS) to the subordinate entity (e.g., UE). In some configurations, the DL data portion 604 may be a physical DL shared channel (PDSCH).

The DL-centric subframe may also include a common UL portion 606. The common UL portion 606 may sometimes be referred to as an UL burst, a common UL burst, and/or various other suitable terms. The common UL portion 606 may include feedback information corresponding to various other portions of the DL-centric subframe. For example, the common UL portion 606 may include feedback information corresponding to the control portion 602. Non-limiting examples of feedback information may include an ACK signal, a NACK signal, a HARQ indicator, and/or various other suitable types of information. The common UL portion 606 may include additional or alternative information, such as information pertaining to random access channel (RACH) procedures, scheduling requests (SRs), and various other suitable types of information. As illustrated in FIG. 6, the end of the DL data portion 604 may be separated in time from the beginning of the common UL portion 606. This time separation may sometimes be referred to as a gap, a guard period, a guard interval, and/or various other suitable terms. This separation provides time for the switch-over from DL communication (e.g., reception operation by the subordinate entity (e.g., UE)) to UL communication (e.g., transmission by the subordinate entity (e.g., UE)). One of ordinary skill in the art will understand that the foregoing is merely one example of a DL-centric subframe and alternative structures having similar features may exist without necessarily deviating from the aspects described herein.

Figure 7:
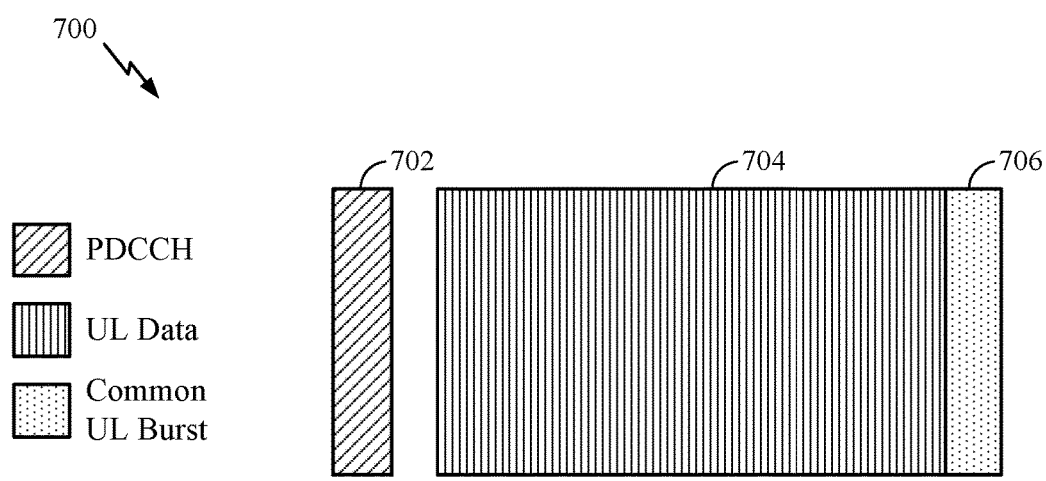
FIG. 7 illustrates an example of an UL-centric subframe, in accordance with certain aspects of the present disclosure.

FIG. 7 is a diagram 700 showing an example of an UL-centric subframe. The UL-centric subframe may include a control portion 702. The control portion 702 may exist in the initial or beginning portion of the UL-centric subframe. The control portion 702 in FIG. 7 may be similar to the control portion described above with reference to FIG. 6. The UL-centric subframe may also include an UL data portion 704. The UL data portion 704 may sometimes be referred to as the payload of the UL-centric subframe. The UL data portion may refer to the communication resources utilized to communicate UL data from the subordinate entity (e.g., UE) to the scheduling entity (e.g., UE or BS). In some configurations, the control portion 702 may be a physical DL control channel (PDCCH).

As illustrated in FIG. 7, the end of the control portion 702 may be separated in time from the beginning of the UL data portion 704. This time separation may sometimes be referred to as a gap, guard period, guard interval, and/or various other suitable terms. This separation provides time for the switch-over from DL communication (e.g., reception operation by the scheduling entity) to UL communication (e.g., transmission by the scheduling entity). The UL-centric subframe may also include a common UL portion 706. The common UL portion 706 in FIG. 7 may be similar to the common UL portion 706 described above with reference to FIG. 7. The common UL portion 706 may additionally or alternatively include information pertaining to channel quality indicator (CQI), sounding reference signals (SRSs), and various other suitable types of information. One of ordinary skill in the an will understand that the foregoing is merely one example of an UL-centric subframe and alternative structures having similar features may exist without necessarily deviating from the aspects described herein.

In some circumstances, two or more subordinate entities (e.g., UEs) may communicate with each other using sidelink signals. Real-world applications of such sidelink communications may include public safety, proximity services, UE-to-network relaying, vehicle-to-vehicle (V2V) communications, Internet of Everything (IoE) communications, IoT communications, mission-critical mesh, and/or various other suitable applications. Generally, a sidelink signal may refer to a signal communicated from one subordinate entity (e.g., UE1) to another subordinate entity (e.g., UE2) without relaying that communication through the scheduling entity (e.g., UE or BS), even though the scheduling entity may be utilized for scheduling and/or control purposes. In some examples, the sidelink signals may be communicated using a licensed spectrum (unlike wireless local area networks, which typically use an unlicensed spectrum).

A UE may operate in various radio resource configurations, including a configuration associated with transmitting pilots using a dedicated set of resources (e.g., a radio resource control (RRC) dedicated state, etc.) or a configuration associated with transmitting pilots using a common set of resources (e.g., an RRC common state, etc.). When operating in the RRC dedicated state, the UE may select a dedicated set of resources for transmitting a pilot signal to a network. When operating in the RRC common state, the UE may select a common set of resources for transmitting a pilot signal to the network. In either case, a pilot signal transmitted by the UE may be received by one or more network access devices, such as an AN, or a DU, or portions thereof. Each receiving network access device may be configured to receive and measure pilot signals transmitted on the common set of resources, and also receive and measure pilot signals transmitted on dedicated sets of resources allocated to the UEs for which the network access device is a member of a monitoring set of network access devices for the UE. One or more of the receiving network access devices, or a CU to which receiving network access device(s) transmit the measurements of the pilot signals, may use the measurements to identify serving cells for the UEs, or to initiate a change of serving cell for one or more of the UEs.

Methods and Apparatus for Testing Millimeter Wave Devices

To ensure that wireless devices (e.g., user equipment) perform effectively, a variety of tests are performed that simulate conditions that the wireless devices may face in real environments. A number of testing methods and models have been used in the past for testing the performance of wireless devices in 2/3/4G communication networks (e.g., Joint Technical Committee (JTC) model). With the introduction of millimeter wave (mmWave) bands in 5G communication networks, however, the testing paradigm is changing. For example, in some cases, a chamber-based testing environment, having antennas that perform far-field over-the-air (OTA) transmissions, is utilized to test wireless devices working with mmWave bands (e.g., carrier frequencies at least above 6 GHz).

In addition, a variety of testing models originating from the WINNER II Channel models may be used in conjunction with the chamber-based testing environment. WINNER II channel models are geometry-based stochastic models, for modeling of the radio channel, that enable separation of propagation parameters and antennas. Examples of channel models derived from the WINNER II Channel models are the clustered delay line (CDL) models. The CDL models provide fixed large-scale and small-scale parameters for transmitting signals and are used for calibration and comparison of different simulations. The CDL models are especially a good fit for testing mmWave band wireless devices, which unlike older fading models for testing 2/3/4G wireless devices, account for directionality of signals. Since mmWave technologies utilize beamforming, directionality of signals may be important.

The CDL model uses 13 to 24 clusters per channel model (corresponding to 13 to 24 sets of parameters for transmitting), where each cluster includes 20 discrete ray sources (corresponding to transmitted signals) per cluster. Each cluster of a CDL channel model, as described above, corresponds to a set of parameters such as normalized delay, average power of the rays, mean azimuth arrival angle or angle of arrival (AoA), mean azimuth departure angle or angle of departure (AoD), mean zenith angle of arrival (ZoA), and mean zenith angle of departure (ZoD).

FIG. 8 illustrates an example table including 23 clusters for a single CDL channel model (e.g., CDL-A, as described below), in accordance with some embodiments. As shown by FIG. 8, each cluster corresponds to a set of parameters for simulating a certain testing scenario.

Figure 9:
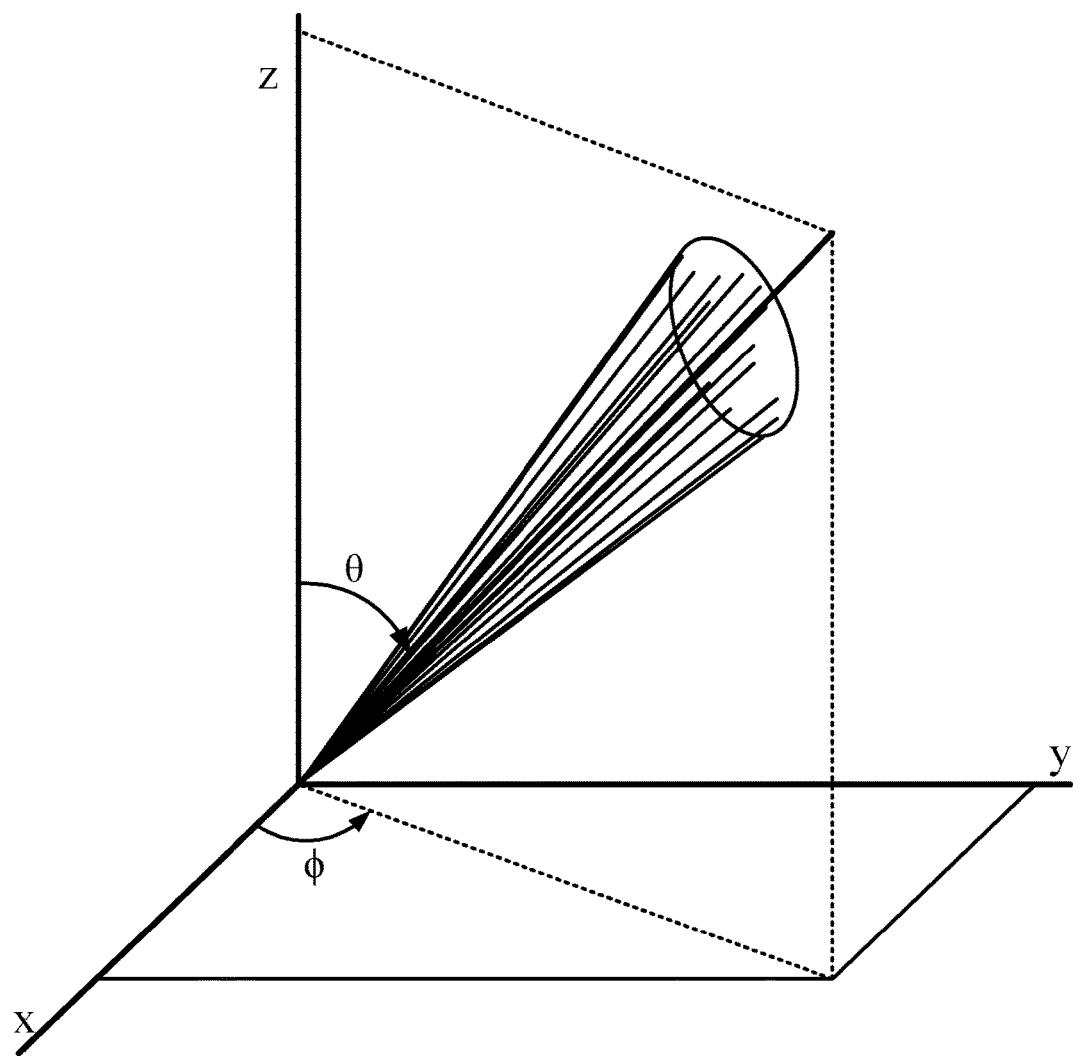
FIG. 9 illustrates an example of an angular spread of a cluster in the CDL model, in accordance with certain aspects of the present disclosure.

FIG. 9 illustrates an example of a cluster's angular spread in accordance with some embodiments. As described above, in some embodiments, each cluster comprises 20 rays that synthesize a Doppler spread, where each ray has its own Doppler shift (a shift in the wavelength of each ray), depending on its angle with the velocity direction. The Doppler spread is shown in FIG. 9 as the spectral widening or broadening of the rays. In some embodiments, when the antenna response from a device-under-test (DUT) is centered on the cluster, the resulting spectra are roughly centered around the Doppler shift of the cluster mean. But when the antenna response is not well-centered on the cluster, spatial filtering of the antenna tilts the channel response spectra. Doppler spread per cluster is determined by velocity, the cluster's angular spread, and the antenna response, if it does not pass all of the rays in the cluster.

As described above, CDL channel modeling may be performed using a chamber-based testing environment. For example, in some embodiments, an isolation chamber may be used for testing that has a number of antennas situated at various locations around the chamber for transmitting mmWave frequency signals over the air.

Figure 10A:
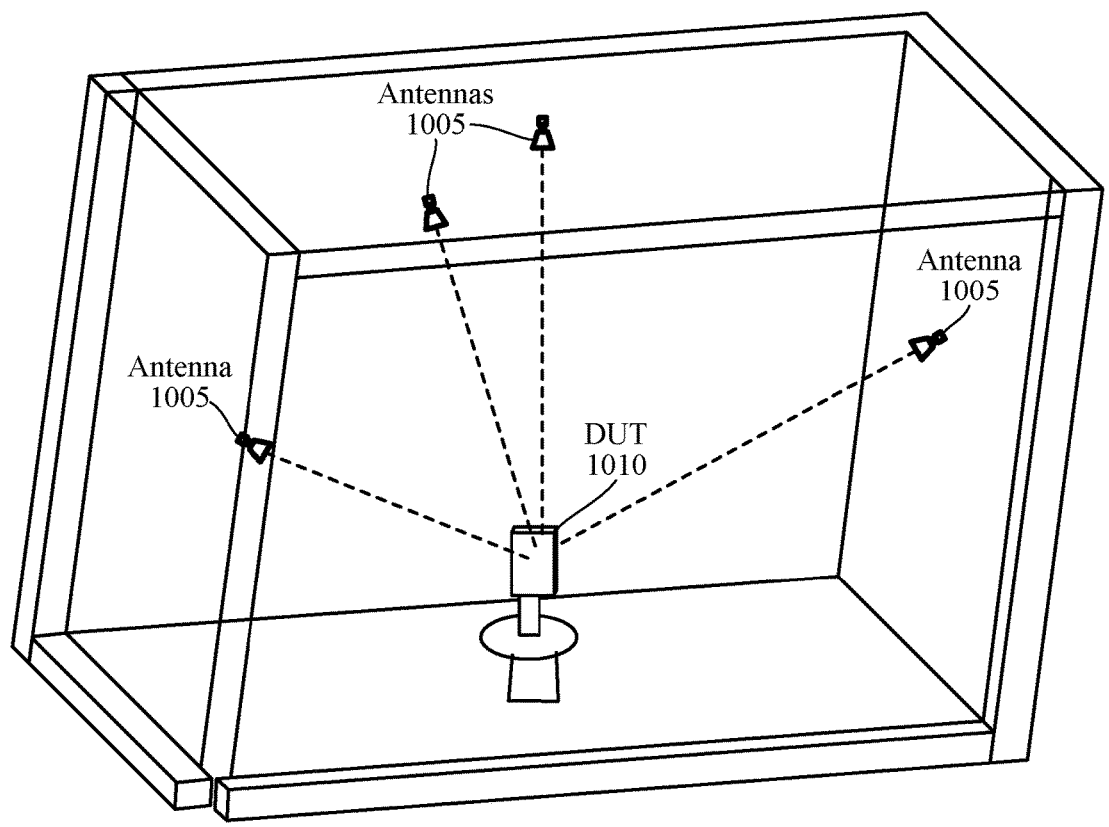
FIGS. 10a and 10b illustrate example test chambers, each having a number of antennas, for use in implementing the CDL model or other directional channel models, in accordance with certain aspects of the present disclosure.
Figure 10B:
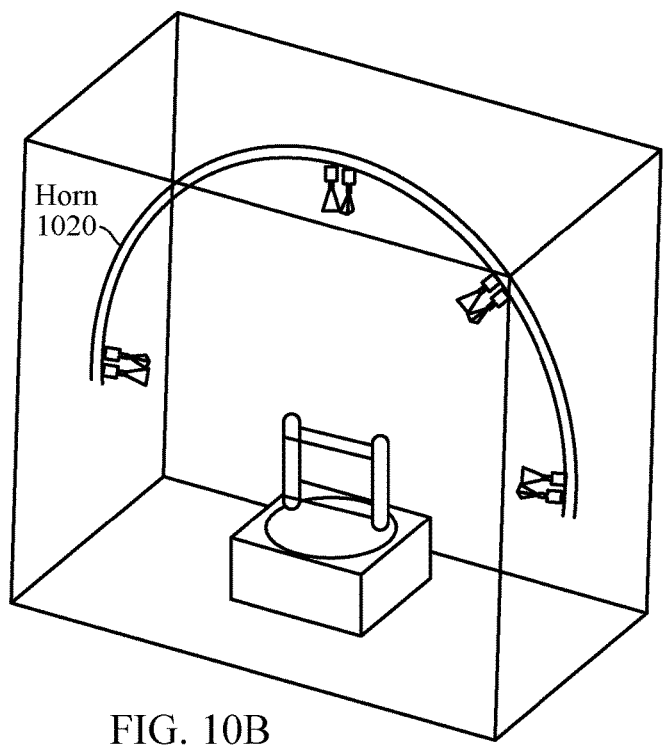

FIGS. 10a and 10b illustrate example test chambers, each having a number of antennas, for use in implementing the CDL model or other directional channel models. FIG. 10a shows four antennas 1005 situated at various locations inside the test chamber. In some embodiments, these locations may be chosen to match positions of signals transmitted in standardized models such as CDL models. In some embodiments, the antennas are beyond near-field (i.e., they are far-field) in order to engage DUT beamformers properly. DUT 1010, in some embodiments, is a mmWave wireless device located within the test chamber on positioner 1015 that holds the device and can also rotate it around a number of different axes, as necessary.

FIG. 10b also shows a similar test chamber with four antennas 1005 installed on horn 1020 allowing the location of each of the antennas to be moved along it depending on the simulation parameters. As described above, using such antennas, a number of clusters (e.g., 13-24), each corresponding to a set of parameters, may be generated for transmitting a number of rays per-cluster (e.g., 20 rays per cluster) to a DUT under a certain CDL channel model.

In some embodiments, a test chamber used for implementing the embodiments described below may comprise a different number of antennas. For example, the test chamber may include 4 or 8 antennas or another suitable number of antennas. Also, in some embodiments, a test chamber may include one or more central processing units (CPUs), system memory, and non-volatile data storage for implementing the embodiments discussed herein.

Figure 11A:
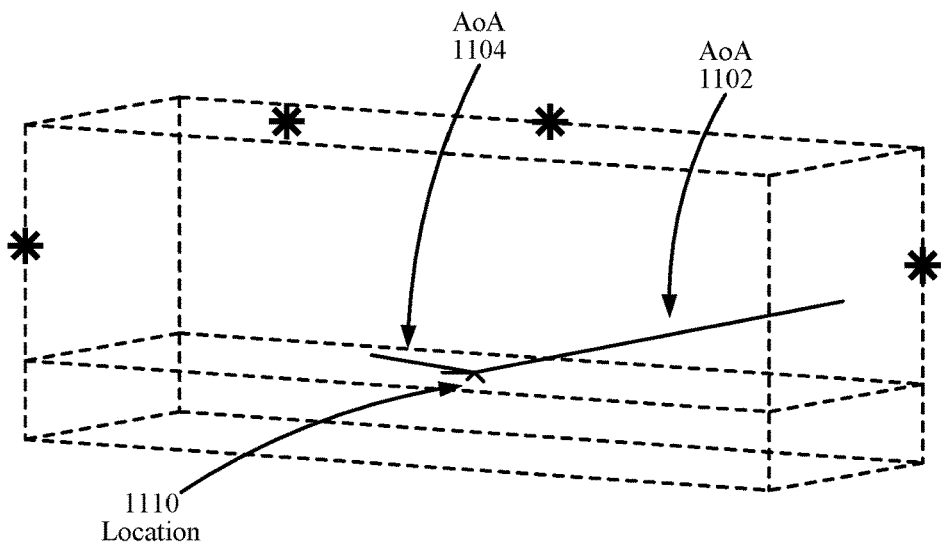
FIGS. 11a, 11b, and 11c illustrate example CDL channel models, implemented using a test chamber, such as the test chamber of FIG. 10a or 10b, in accordance with certain aspects of the present disclosure.
Figure 11B:
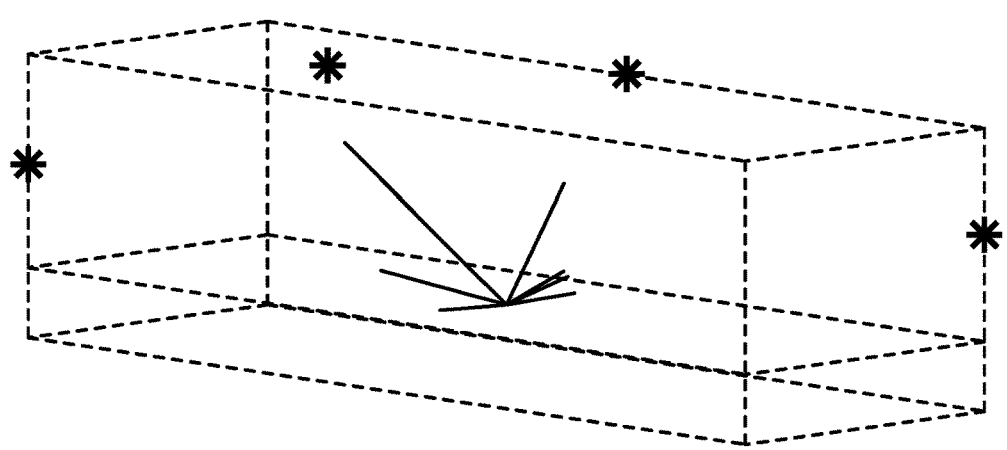
Figure 11C:
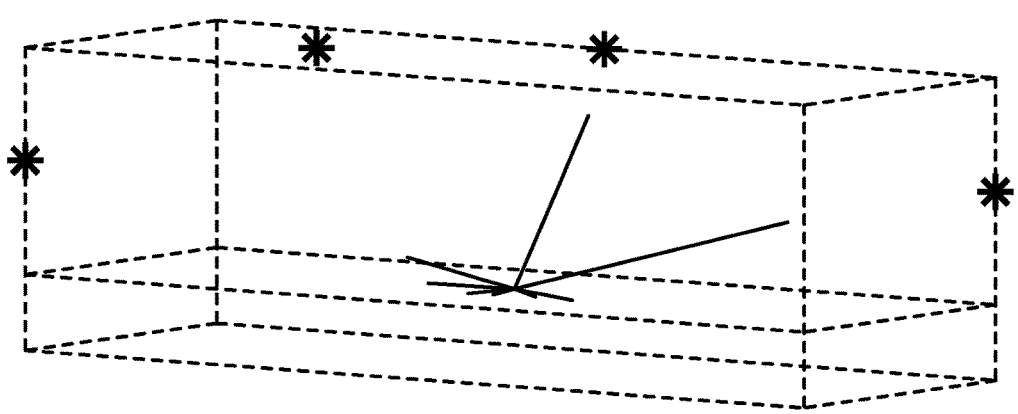

FIGS. 11a, 11b, and 11c illustrate CDL channel models A, B and C, respectively, implemented using a test chamber, such as the test chamber of FIG. 10a or 10b. Each one of test chambers shown in FIGS. 11a, 11b, and 11c shows a number of clusters (e.g., 23) each having an AoA. For example, FIG. 11a shows a number of vectors, each corresponding to a certain cluster(s)' mean angle (e.g., AoA 1102, AoA 1104) at which signals of the cluster(s) are arriving at a DUT, whose location is shown as location 1110 within the test chamber. AoAs shown in FIG. 11a correspond to 23 clusters of the CDL channel model CDL-A of FIG. 8, although some AoAs angle (e.g., AoA 1102, AoA 1104) are more dominant than others, as shown by their larger lengths (the longer the length of the AoA's vector, the higher the energy associated with that direction). FIGS. 11b and 11c also show test chambers each with a number of AoA vectors corresponding to 23 clusters of CDL channel models CDL-B and CDL-C, respectively.

In order to generate and transmit the 20 rays of each of the 23 clusters of a CDL channel model shown in FIGS. 11a-11c, a very large number of antennas would be required. However, even if such a large number of antennas were used in the test chamber, a mmWave band wireless device, acting as a DUT, may not receive all the signals propagated by those antennas because of beamforming, or may receive some signals at a very low power level such that they do not affect the operations of the wireless device much. More specifically, a mmWave band wireless device performs beamforming by generating stronger lobes in certain directions and weaker lobes in others for receiving signals, where stronger lobes of the received signals are less attenuated, and for weaker lobes the received signals are more attenuated. In directions where the wireless device under test (DUT) is generating strong lobes, the antenna received response is higher because the DUT can more effectively receive the incoming signal. Therefore, propagating clusters, using antennas in a test chamber, that are not pointed to the direction of the DUT's strong lobes is not always necessary.

Accordingly certain embodiments described herein relate to using reference antenna responses of the DUT to generate fading coefficients for chamber antennas in a test chamber. In certain aspects, the reference antenna response is different or unique for each antenna and antenna polarity. For example, for four directional antennas having dual-polarity, there are eight different reference antenna responses. The reference antenna response of the antennas and polarities may be fully independent or have a common shape but different direction and polarity when used to compute fading coefficients as discussed herein.

Figure 12:
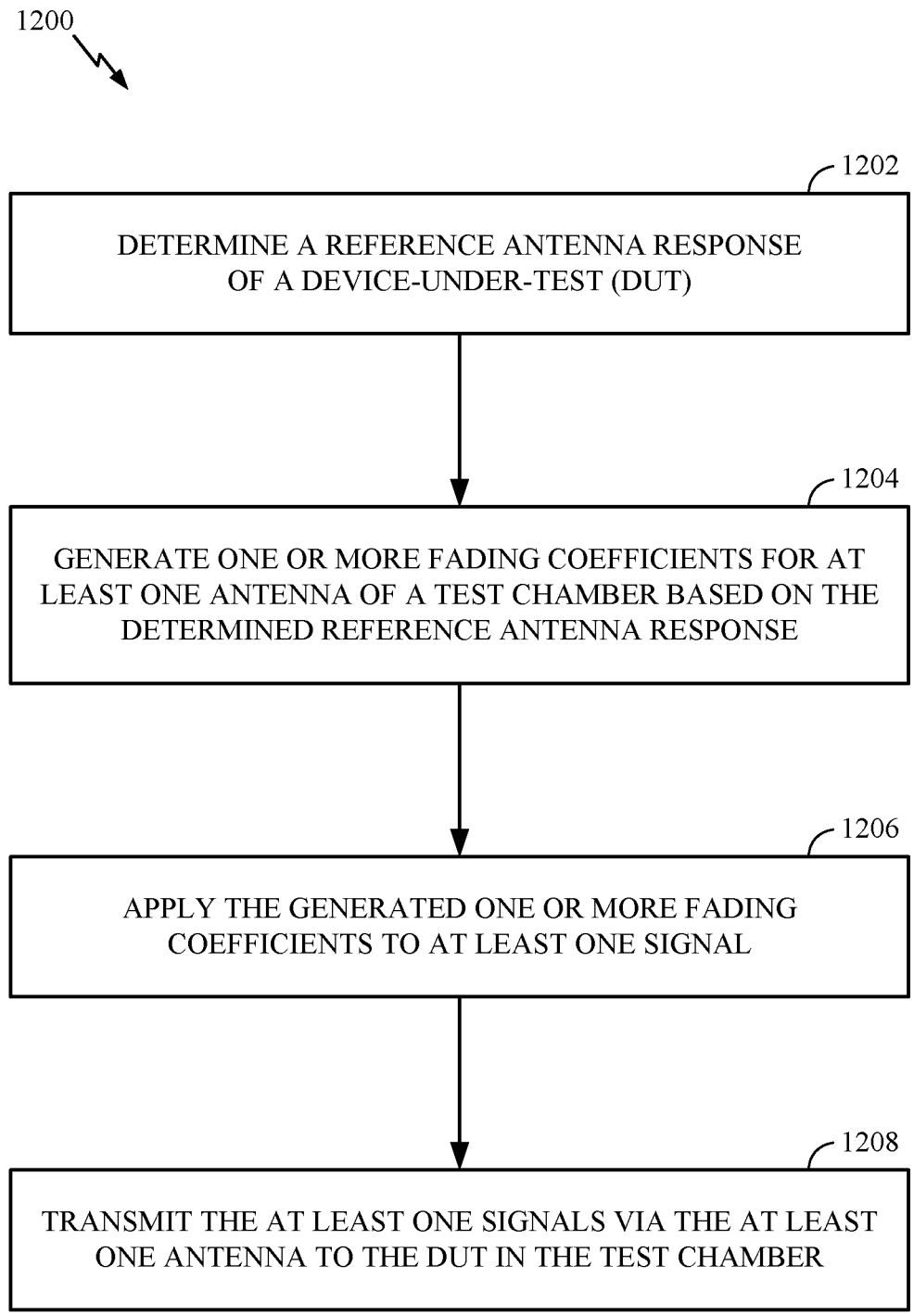
FIG. 12 illustrates example operations for use by a test chamber, in accordance with certain aspects of the present disclosure.

FIG. 12 illustrates example operations 1200 for testing a wireless DUT, according to aspects of the present disclosure. The device performing operations 1200 may be, for example, a test chamber. Operations 1200 begin, at 1202, by determining a reference antenna response of a DUT. At 1204, operations 1200 continue by generating one or more fading coefficients for at least one antenna of a test chamber based on the determined reference antenna response. At 1206, operations 1200 continue by applying the generated one or more fading coefficients to at least one signal. At 1208, operations 1200 continue by transmitting the at least one signal via the at least one antenna to the DUT in the test chamber.

As described above, in some embodiments, a test or isolation chamber (e.g., as shown in FIGS. 10a-10b) may be used for testing a wireless DUT that supports beamforming and mmWave communications. The test chamber may include a number of antennas situated at various locations around the chamber (e.g., as shown in FIGS. 10a-10b and 11a-11c) for generating signals to transmit to the DUT to simulate different signal scenarios the DUT may experience in the real world and determine whether the DUT operates as expected in the different scenarios. In certain aspects, the antennas give a single angle-of-arrival towards the DUT, so that transmissions from the antennas to the DUT are directional.

Figure 13:
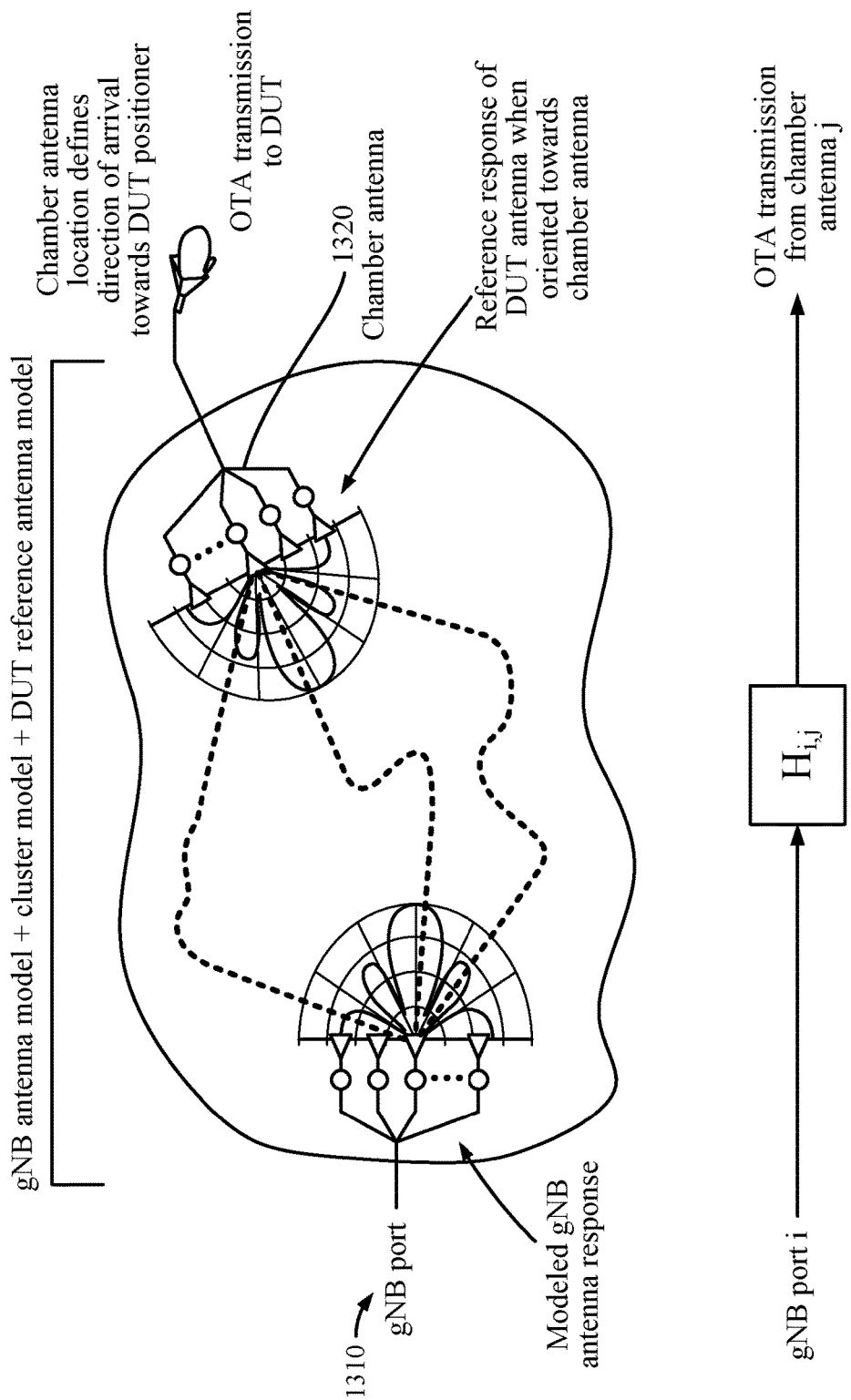
FIG. 13 illustrates an example of a chamber antenna coupled to a base station port, in accordance with certain aspects of the present disclosure.

In certain aspects, the antennas are configured to transmit signals corresponding to simulated transmissions of a base station (e.g., gNodeB (gNB)). For example, the antennas may be coupled to an output (e.g., output ports) of a base station that is used to generate signals and transmit them via the antennas. FIG. 13 illustrates an example of a chamber antenna 1320 coupled to a gNB port 1310. As shown in FIG. 13, gNB port 1310 generates signals that are then faded using a fading coefficient (Hi,j) before reaching chamber antenna 1320. The "i" in the fading coefficient (Hi,j) refers to the gNB port output number and the "j" refers to the chamber antenna that transmits the signals received from gNB port output "i" to the DUT. The different signal scenarios generated by the base station to be transmitted by the antennas may correspond to the scenarios and signals defined by different CDL models.

As described above, a DUT may support beamforming and accordingly different weighting patterns can be achieved for receiving signals in different spatial directions. The weighting patterns may include lobes, including lobes with a higher weighting such as a main lobe, and lobes with lower weighting, such as side lobes and back lobes. Accordingly, signals received in the direction of the main lobe may be received with a higher amplitude or weight than signals received in the side lobes.

As discussed, it may not be feasible or necessary to transmit all clusters in a CDL model to the DUT, and instead only certain clusters may be transmitted by each chamber antenna, such as those in the presumed direction of a main lobe of the DUT. For example, as the test chamber may not possess any information relating to where the main lobe of the DUT is actually pointed, at a given point in time, the test chamber presumes that a main lobe of the DUT is pointed towards one or each of the chamber antennas and, using each chamber antenna, transmits only those clusters that are in the direction of the chamber antenna to the DUT (e.g., of a main lobe of the DUT that is presumed to be pointed towards that chamber antennas). In certain aspects, the chamber antennas are positioned to best represent the CDL model with as much power as possible (as much power of the overall power of clusters of the CDL model), given the reduced number of directions represented by the antennas. In certain aspects, a different subset of clusters of the CDL model may, therefore, be transmitted by each chamber antenna. Further, in certain aspects, one or more of the chamber antennas may not have corresponding clusters in the model in the direction of the chamber antenna and therefore may not transmit a signal. Accordingly, in some embodiments, a set of fading coefficients (Hi,j) for each antenna is applied to signals received from a base station port before they are propagated by the antennas. These fading coefficients may be based on an estimated or assumed weighting pattern or antenna response of the DUT, such that the signals are faded based on the beamforming pattern of the DUT. As discussed, the antenna response used for calculating the fading coefficients may be different for each chamber antenna and polarity.

Figure 14:
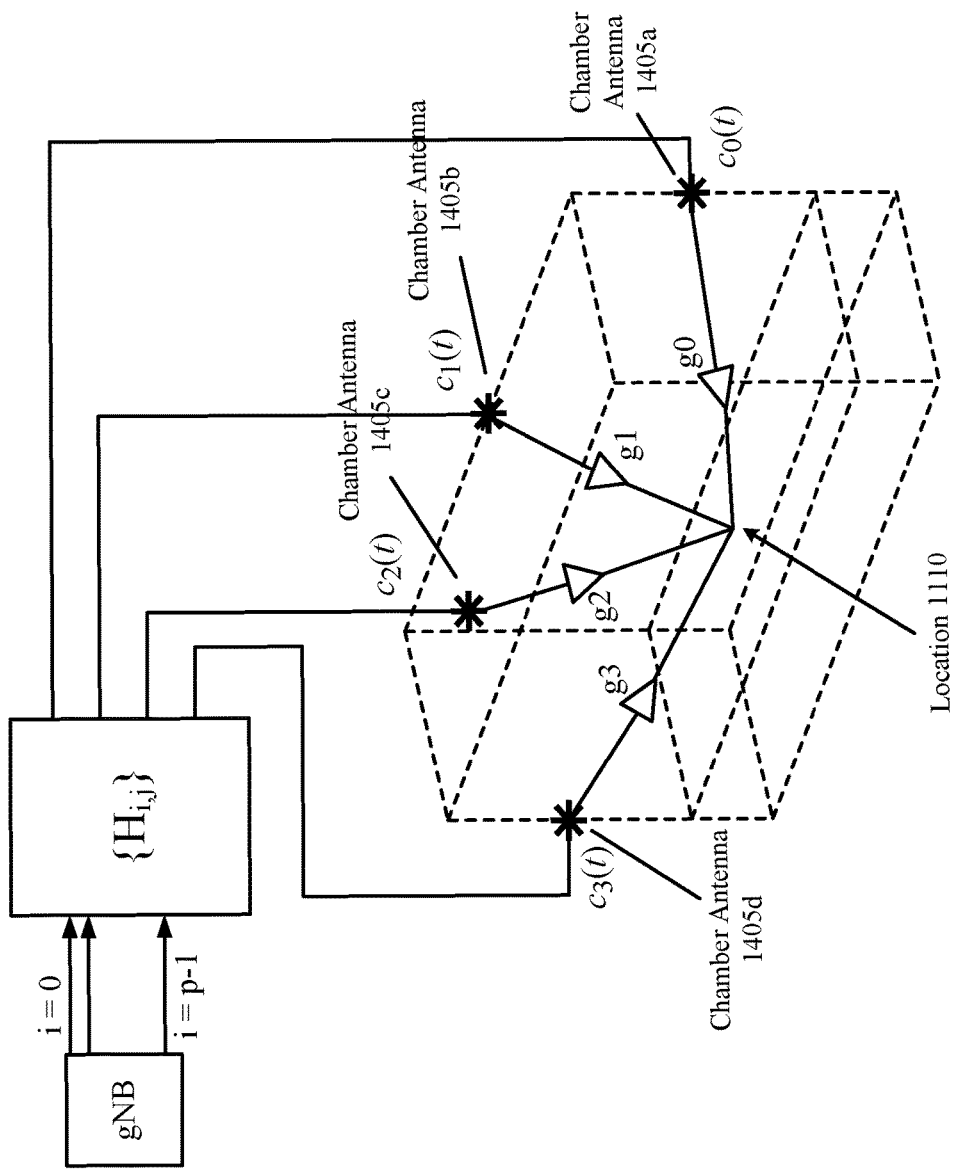
FIG. 14 illustrates an example base station generating and applying a number of fading coefficients to one or more signals and transmitting the signals to chamber antennas of a test chamber, in accordance with certain aspects of the present disclosure.

FIG. 14 shows an example gNB port outputting a plurality of signals from port outputs "0" to "p-1" and a fading coefficient (Hi,j) being applied to each one of the signals based on which gNB port output number "i" the signal is being generated by and which chamber antenna "j" the signal is arriving at for transmission to the DUT. As described above, the fading coefficients are determined based on the weighting pattern or reference antenna responses of the DUT. For example, in some embodiments, it may be assumed that the DUT's antenna response pattern is pointed towards the chamber antennas.

FIG. 14 illustrates four antennas, where each polarity of each antenna 1405a-d generates a chamber antenna output c(t) (i.e., $c_0(t)$-$c_3(t)$, respectively) resulting in a certain gain (g) (i.e., g0-g3, respectively) associated with the DUT's actual beamformed antenna response in the direction of the corresponding chamber antenna. As described above, the chamber antenna output results from the application of a set of fading coefficients (Hi,j) for each antenna to signals received from a base station port. Output signals generated by a certain base station port at a certain point in time may be shown as $\{x_i(t)\}$, where i identifies the base station output port number (where p is the total number of ports) and t represents time. In addition, the chamber antenna output for a certain polarity is shown as:

$$c(t) = \begin{bmatrix} c0(t) \\ c1(t) \\ c2(t) \\ c3(t) \end{bmatrix} = H \begin{bmatrix} x0(t) \\ x1(t) \\ \vdots \\ x(p-1)(t) \end{bmatrix}$$

As describe above, the DUT antenna response (per sub-array, per polarity) determines the set of gains {g0, g1, g2, and g3} in the direction of the chamber antennas 1405a-d. After the propagation of the signals by the chamber antennas 1405a-d, the DUT antenna received signal may be:

$$\underline{y}(t)=[g0\ g1\ g2\ g3]\underline{c}(t)=g^TH\underline{x}(t)$$

As described above, in some embodiments, chamber antennas may transmit certain clusters to the DUT (at location 1110) with the presumption that the DUT's optimal beamformed response is in their direction. In such embodiments, if the DUT's optimal beamformed response actually is in the direction of the chamber antennas, then the gains corresponding to the DUT's beamformed response would be greater. But if the DUT does not beamform well in the direction of the chamber antennas, then the gains associated with the DUT's beamformed response would be weaker.

The DUT's antenna response may vary in direction in a search for a preferred beamformed antenna response. That is, in some embodiments, the DUT dynamically updates its beam direction using a number of beam management algorithms in order to find the best performing beam direction. The DUT's beam direction may change simply due to channel fading dynamics or noise, or the beam direction may change as it has to track a preferred direction as the chamber positioner (on which the DUT is mounted) rotates the DUT to simulate a field condition (e.g. a DUT is rotated as someone turns around). Additional examples of the change in the DUT's beam direction are handover scenarios where the DUT needs to switch from listening to one dominant direction (chamber antenna) to listening to a different direction, where a new and stronger cell may be appearing.

Further, in certain aspects, only clusters defined in the direction of a given chamber antenna from the DUT (e.g., arriving from the direction of a chamber antenna) may be represented (e.g., signals corresponding to transmitted) by that given chamber antenna, since other clusters may not be received at the DUT from the given chamber antenna with high power under the assumption that the reference DUT antenna response is beamformed towards the chamber antenna. For example, the fading coefficients H_i,1 that are applied to signals to be transmitted from chamber antenna 1 are obtained using a reference DUT antenna response that points its main lobe towards antenna 1. In some embodiments, this reference antenna response is directionally selective and substantially attenuates (or rejects) clusters whose arrival directions are not within the main lobe of reference response 1. In such an example, only a subset containing these dominant clusters, given reference antenna response 1, would be modeled for transmission by chamber antenna 1.

Also in some embodiments, an antenna from a number of antennas in a chamber may represent or transmit zero clusters. In such embodiments, at least one chamber antenna may emulate a cluster from a plurality of clusters corresponding to a CDL channel model while other chamber antennas may emulate zero to more clusters from the plurality of clusters. In embodiments where the test chamber only comprises one chamber antenna, at least one cluster may be emulated by the chamber antenna.

In some embodiments, a unity gain may be applied to the rays comprising cluster(s) selected to be transmitted by a certain chamber antenna. However, in some other embodiments, a non-constant gain may be applied to the rays comprising the cluster(s) selected to be transmitted by a certain chamber antenna.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

The various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

For example, means for transmitting and/or means for receiving may comprise one or more of a transmit processor 420, a TX MIMO processor 430, a receive processor 438, or antenna(s) 434 of the base station 110 and/or the transmit processor 464, a TX MIMO processor 466, a receive processor 458, or antenna(s) 452 of the user equipment 120. Additionally, means for generating, means for multiplexing, and/or means for applying may comprise one or more processors, such as the controller/processor 440 of the base station 110 and/or the controller/processor 480 of the user equipment 120.

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the PHY layer. In the case of a user terminal 120 (see FIG. 1), a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further. The processor may be implemented with one or more general-purpose and/or special-purpose processors. Examples include microprocessors, microcontrollers, DSP processors, and other circuitry that can execute software. Those skilled in the art will recognize how best to implement the described functionality for the processing system depending on the particular application and the overall design constraints imposed on the overall system.

If implemented in software, the functions may be stored or transmitted over as one or more instructions or code on a computer readable medium. Software shall be construed broadly to mean instructions, data, or any combination thereof, whether referred to as software, firmware, middleware, microcode, hardware description language, or otherwise. Computer-readable media include both computer storage media and communication media including any medium that facilitates transfer of a computer program from one place to another. The processor may be responsible for managing the bus and general processing, including the execution of software modules stored on the machine-readable storage media. A computer-readable storage medium may be coupled to a processor such that the processor can read information from, and write information to, the storage medium. In the alternative, the storage medium may be integral to the processor. By way of example, the machine-readable media may include a transmission line, a carrier wave modulated by data, and/or a computer readable storage medium with instructions stored thereon separate from the wireless node, all of which may be accessed by the processor through the bus interface. Alternatively, or in addition, the machine-readable media, or any portion thereof, may be integrated into the processor, such as the case may be with cache and/or general register files. Examples of machine-readable storage media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer-program product.

A software module may comprise a single instruction, or many instructions, and may be distributed over several different code segments, among different programs, and across multiple storage media. The computer-readable media may comprise a number of software modules. The software modules include instructions that, when executed by an apparatus such as a processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module below, it will be understood that such functionality is implemented by the processor when executing instructions from that software module.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared (IR), radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Blu-ray® disc where disks usually reproduce data magnetically, while discs reproduce data optically with lasers. Thus, in some aspects computer-readable media may comprise non-transitory computer-readable media (e.g., tangible media). In addition, for other aspects computer-readable media may comprise transitory computer-readable media (e.g., a signal). Combinations of the above should also be included within the scope of computer-readable media.

Thus, certain aspects may comprise a computer program product for performing the operations presented herein. For example, such a computer program product may comprise a computer-readable medium having instructions stored (and/or encoded) thereon, the instructions being executable by one or more processors to perform the operations described herein.

Further, it should be appreciated that modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a user terminal and/or base station can obtain the various methods upon coupling or providing the storage means to the device.

Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A method of testing a wireless device-under-test (DUT), the method comprising:
   determining a reference antenna response of the DUT for at least one antenna of a test chamber;
   generating one or more fading coefficients for the at least one antenna based on the determined reference antenna response;
   applying the generated one or more fading coefficients to at least one signal; and
   transmitting the at least one signal via the at least one antenna to the DUT in the test chamber.

2. The method claim 1, wherein the at least one signal corresponds to at least one cluster selected from a plurality of clusters for the at least one antenna based on a clustered delay line model and the reference antenna response.

3. The method of claim 2, wherein a non-constant gain is applied to the at least one selected cluster.

4. The method of claim 1, wherein the at least one antenna comprises a plurality of antennas.

5. The method of claim 1, wherein the reference antenna response is for a first polarity of the at least one antenna, and further comprising determining a second reference antenna response of the DUT for a second polarity of the at least one antenna.

6. The method of claim 1, wherein the reference antenna response is for multiple polarities of the at least one antenna.

7. The method of claim 1, wherein the test chamber comprises a plurality of additional antennas.

8. The method claim 7, wherein the at least one signal corresponds to at least one cluster selected from a plurality of clusters for the at least one antenna based on a clustered delay line model and the reference antenna response, and wherein each of the plurality of additional antennas represents zero or more clusters selected from the plurality of clusters based on the clustered delay line model and one or more reference antenna responses of the plurality of additional antennas.

9. The method claim 7, wherein the at least one signal corresponds to at least one cluster selected from a plurality of clusters for the at least one antenna based on a clustered delay line model and the reference antenna response, wherein each of the plurality of additional antennas represents zero or more clusters selected from the plurality of clusters based on the clustered delay line model and one or more reference antenna responses of the plurality of additional antennas, and wherein a non-constant gain is applied to each of the zero or more selected clusters.

10. The method of claim 7, further comprising determining a second reference antenna response of the DUT for a second antenna of the plurality of additional antennas.

11. The method of claim 7, further comprising:
   determining one or more reference antenna responses of the DUT for one or more of the plurality of additional antennas;
   generating one or more fading coefficients for each of the one or more of the plurality of additional antennas based on the corresponding one or more determined reference antenna responses;
   applying the generated one or more fading coefficients for each of the one or more of the plurality of additional antennas to one or more signals corresponding to the one or more of the plurality of additional antennas; and
   transmitting the one or more signals via the corresponding one or more of the plurality of additional antennas to the DUT in the test chamber.

12. The method of claim 1, wherein the reference antenna response is beamformed.

13. The method of claim 1, wherein the reference antenna response is directional.

14. The method of claim 1, wherein the generating one or more fading coefficients is further based on a clustered delay line (CDL) model.

15. A testing apparatus comprising:
   one or more antennas;
   a memory; and
   a processor, the processor being configured to:
      determine a reference antenna response of the DUT for at least one antenna of the one or more antennas of the testing apparatus;
      generate one or more fading coefficients for the at least one antenna based on the determined reference antenna response;
      apply the generated one or more fading coefficients to at least one signal; and
      transmit the at least one signal via the at least one antenna to the DUT in the testing apparatus.

16. The testing apparatus of claim 15, wherein the at least one signal corresponds to at least one cluster selected from a plurality of clusters for the at least one antenna based on a clustered delay line model and the reference antenna response.

17. The testing apparatus of claim 16, wherein a non-constant gain is applied to the at least one selected cluster.

18. The testing apparatus of claim 15, wherein the at least one antenna comprises a plurality of antennas.

19. The testing apparatus of claim 15, wherein the reference antenna response is for a first polarity of the at least one antenna, and wherein the processor is further configured to:
   determine a second reference antenna response of the DUT for a second polarity of the at least one antenna.

20. The testing apparatus of claim 15, wherein the reference antenna response is for multiple polarities of the at least one antenna.

21. The testing apparatus of claim 15, wherein the testing apparatus comprises a plurality of additional antennas.

22. The testing apparatus of claim 21, wherein the at least one signal corresponds to at least one cluster selected from a plurality of clusters for the at least one antenna based on a clustered delay line model and the reference antenna response, and wherein each of the plurality of additional antennas represents zero or more clusters selected from the plurality of clusters based on the clustered delay line model and one or more reference antenna responses of the plurality of additional antennas.

23. The testing apparatus of claim 21, wherein the at least one signal corresponds to at least one cluster selected from a plurality of clusters for the at least one antenna based on a clustered delay line model and the reference antenna response, wherein each of the plurality of additional antennas represents zero or more clusters selected from the plurality of clusters based on the clustered delay line model and one or more reference antenna responses of the plurality of additional antennas, and wherein a non-constant gain is applied to each of the zero or more selected clusters.

24. The testing apparatus of claim 21, wherein the processor is further configured to:
    determine a second reference antenna response of the DUT for a second antenna of the plurality of additional antennas.

25. The testing apparatus of claim 21, wherein the processor is further configured to:
    determine one or more reference antenna responses of the DUT for one or more of the plurality of additional antennas;
    generate one or more fading coefficients for each of the one or more of the plurality of additional antennas based on the corresponding one or more determined reference antenna responses;
    apply the generated one or more fading coefficients for each of the one or more of the plurality of additional antennas to one or more signals corresponding to the one or more of the plurality of additional antennas; and
    transmit the one or more signals via the corresponding one or more of the plurality of additional antennas to the DUT in the testing apparatus.

26. The testing apparatus of claim 15, wherein the reference antenna response is beamformed.

27. The testing apparatus of claim 15, wherein the reference antenna response is directional.

28. The testing apparatus of claim 15, wherein the generating one or more fading coefficients is further based on a clustered delay line (CDL) model.

29. An apparatus for wireless communications, comprising:
    means for determining a reference antenna response of the DUT for at least one antenna of a testing apparatus;
    means for generating one or more fading coefficients for the at least one antenna based on the determined reference antenna response;
    means for applying the generated one or more fading coefficients to at least one signal; and
    means for transmitting the at least one signal via the at least one antenna to the DUT in the test chamber.

30. A non-transitory computer readable medium comprising instructions to be executed in a computer system, wherein the instructions when executed in the computer system perform a method for testing a wireless device-under-test (DUT), the method comprising:
    determining a reference antenna response of the DUT for at least one antenna of a test chamber;
    generating one or more fading coefficients for the at least one antenna based on the determined reference antenna response;
    applying the generated one or more fading coefficients to at least one signal; and transmitting the at least one signal via the at least one antenna to the DUT in the test chamber.

* * * * *